US008629346B2

United States Patent
Matsui et al.

(10) Patent No.: US 8,629,346 B2
(45) Date of Patent: Jan. 14, 2014

(54) ELECTRODE SUBSTRATE, PHOTOELECTRIC CONVERSION ELEMENT, CONDUCTIVE GLASS SUBSTRATE AND PRODUCTION METHOD THEREOF, AND PIGMENT SENSITIZING SOLAR CELL

(75) Inventors: Hiroshi Matsui, Tokyo (JP); Kenichi Okada, Tokyo (JP); Takuya Kawashima, Tokyo (JP); Nobuo Tanabe, Tokyo (JP); Tetsuya Ezure, Tokyo (JP)

(73) Assignee: Fujikura Ltd., Tokyo (JP)

( * ) Notice: Subject to any disclaimer, the term of this patent is extended or adjusted under 35 U.S.C. 154(b) by 991 days.

(21) Appl. No.: 10/529,818

(22) PCT Filed: Oct. 3, 2003

(86) PCT No.: PCT/JP03/12738
§ 371 (c)(1),
(2), (4) Date: Mar. 31, 2005

(87) PCT Pub. No.: WO2004/032274
PCT Pub. Date: Apr. 15, 2004

(65) Prior Publication Data
US 2006/0162770 A1    Jul. 27, 2006

(30) Foreign Application Priority Data

| Oct. 3, 2002 | (JP) | 2002-291219 |
| Oct. 22, 2002 | (JP) | 2002-306723 |
| Nov. 12, 2002 | (JP) | 2002-328109 |
| Nov. 12, 2002 | (JP) | 2002-328566 |
| Aug. 28, 2003 | (JP) | 2003-305269 |

(51) Int. Cl.
*H01L 31/0224* (2006.01)
*H01G 9/20* (2006.01)

(52) U.S. Cl.
USPC .............. 136/256; 136/263; 136/252; 438/85

(58) Field of Classification Search
USPC .............................. 136/256, 263, 252; 438/85
See application file for complete search history.

(56) References Cited

U.S. PATENT DOCUMENTS 4,396,682 A * 8/1983 Mohri et al. ................... 428/428
4,521,251 A * 6/1985 Otake et al. ............... 106/169.34

(Continued)

FOREIGN PATENT DOCUMENTS

| DE | 4303055 A1 | 8/1993 |
| JP | 60-50975 A | 3/1985 |

(Continued)

OTHER PUBLICATIONS

O'Regan and Graetzel, "A low-cost, high-efficiency solar cell based on dye-sensitized colloidal $TiO_2$ films", *Nature*, vol. 353, Oct. 24, 1991, pp. 737-740.

(Continued)

*Primary Examiner* — Golam Mowla
(74) *Attorney, Agent, or Firm* — Sughrue Mion, PLLC

(57) ABSTRACT

In an electrode substrate 1, the surface of a metal circuit layer 12 is covered and insulated by an insulating layer 14. In a photoelectric conversion element that uses this electrode substrate 1, the metal circuit layer is reliably shielded from an electrolyte solution or the like so that corrosion and leak current thereof is effectively prevented, and the photoelectric conversion efficiency can be improved. The insulating layer 14 is preferably made of a material that contains a glass component, and is particularly preferably formed by printing a paste that contains glass frit. The metal circuit layer 12 is preferably formed using a printing method.

4 Claims, 10 Drawing Sheets

(56) References Cited

U.S. PATENT DOCUMENTS

| | | | |
|---|---|---|---|
| 4,927,721 A | 5/1990 | Gratzel et al. | |
| 6,291,763 B1 * | 9/2001 | Nakamura | 136/256 |
| 6,376,765 B1 * | 4/2002 | Wariishi et al. | 136/263 |
| 6,462,266 B1 | 10/2002 | Kurth | |
| 2002/0014721 A1 | 2/2002 | Beckmann | |
| 2002/0040728 A1 * | 4/2002 | Yoshikawa | 136/263 |

FOREIGN PATENT DOCUMENTS

| | | |
|---|---|---|
| JP | 61-116883 A | 6/1986 |
| JP | 8-15097 B2 | 2/1989 |
| JP | 1-220380 A | 9/1989 |
| JP | 6-204529 A | 7/1994 |
| JP | 6-204541 A | 7/1994 |
| JP | 6-511113 A | 12/1994 |
| JP | 8-51229 A | 2/1996 |
| JP | 9-82997 A | 3/1997 |
| JP | 10-078589 | 3/1998 |
| JP | 2000-243465 A | 9/2000 |
| JP | 2000-285977 | 10/2000 |
| JP | 2001-283941 A | 10/2001 |
| JP | 2001-283943 A | 10/2001 |
| JP | 2001-319698 A | 11/2001 |
| JP | 2001-320068 A | 11/2001 |
| JP | 2002-196685 A | 7/2002 |
| JP | 2000-231942 A | 8/2002 |
| JP | 2002-313443 A | 10/2002 |
| JP | 2002-313444 A | 10/2002 |
| JP | 2002-535808 | 10/2002 |
| JP | 2002-536805 A | 10/2002 |
| JP | 2003-203681 A | 7/2003 |
| JP | 2003-203682 A | 7/2003 |
| JP | 2003-203683 A | 7/2003 |
| JP | 2003-223939 A | 8/2003 |
| JP | 2004-220920 A | 8/2004 |
| WO | WO 91-16719 | 10/1991 |
| WO | 93/18532 A1 | 9/1993 |
| WO | WO 95/06320 | 3/1995 |
| WO | 96/29715 A1 | 9/1996 |
| WO | WO 00/42674 A1 | 7/2000 |
| WO | WO 00/48212 A1 | 8/2000 |

OTHER PUBLICATIONS

Phani et al. "Electric Window Modules based on Nanocrystalline Titania Solar Cells", Paper 1, p. 1-7, Proceedings of Solar '97—Australian and New Zealand Solar Energy Society.

Chinese Patent Application No. 200810126942.9 Office Action, issued Mar. 11, 2010.

Notice of Reasons for Rejection dated Feb. 19, 2013, issued in Japanese Patent Application No. 2010-023558.

* cited by examiner

ELECTRODE SUBSTRATE, PHOTOELECTRIC CONVERSION ELEMENT, CONDUCTIVE GLASS SUBSTRATE AND PRODUCTION METHOD THEREOF, AND PIGMENT SENSITIZING SOLAR CELL

TECHNICAL FIELD

The present invention relates to an electrode substrate and a conductive glass substrate that are used in a photoelectric conversion element, and to a photoelectric conversion element, and a dye-sensitized solar cell.

BACKGROUND ART

Dye-sensitized solar cells are attracting attention as photoelectric conversion elements that are low in cost and enable a high conversion efficiency to be obtained (see, for example, Japanese Unexamined Patent Application, First Publication No. H01-220380; and Michael Graetzel, Nature, United Kingdom, 1991, vol. 737, p. 353). Generally, in this type of photoelectric conversion element, a semiconductor electrode is constructed by forming a porous film with oxide semiconductor nanoparticles of titanium dioxide or the like on a transparent conductive substrate, and then causing a sensitizing dye to be provided in this porous film. This semiconductor electrode is used with a counter electrode made of conductive glass that has been sputtered with platinum, and the space between the two electrodes is filled by a charge transfer layer in the form of an organic electrolyte solution that contains oxidizing species and reducing species such as iodine and iodide ions.

The photoabsorption coefficient is increased by providing this semiconductor electrode with a porous film structure having a large specific surface with a roughness factor of 1000 or more. A photoelectric conversion efficiency with a photoabsorption coefficient of 10% or more has also been reported. It has also been predicted that the cost of dye-sensitized solar cells will be reduced to about ½ to ⅙ of the cost of silicon based solar cells that are currently used. Because dye-sensitized solar cells do not necessarily require complex, large-scale manufacturing facility and neither do they contain harmful substances, they have a strong possibility of becoming inexpensive, mass-produced solar cells that are capable of being widely used.

The transparent conductive substrate is generally one that has been prepared in advance by covering a glass substrate surface with a transparent conductive film of tin-doped indium oxide (ITO), fluorine-doped tin oxide (FTO), or the like using a technique such as sputtering or CVD. However, the specific resistance of ITO or FTO is of the order of $10^{-4}$ to $10^{-3}$ $\Omega \cdot cm$, which is about 100 times greater than the specific resistance of metals such as silver or gold. Consequently, commercially available transparent conductive glass has a high resistance, and when it is used for solar cells, in particular, when it is used for large surface area cells, there is a marked deterioration in the photoelectric conversion efficiency.

One technique of lowering the resistance of transparent conductive glass that has been considered is to form the transparent conductive layer (such as the ITO or FTO) thicker. However, the photoabsorption by a transparent conductive layer increases if the film is formed having a thickness large enough to allow a satisfactory resistance to be obtained, and the ratio of transmitted light deteriorates markedly. By this, the photoelectric conversion efficiency of the solar cell also deteriorates.

As a solution to this problem, investigations are currently underway into lowering the resistance of a substrate that is provided with the transparent conductive layer that is used as a photoelectrode of a solar cell by providing a metal circuit (wiring) layer that does not markedly impair the opening area ratio on the surface of the substrate (see, for example, Japanese Patent Application No. 2001-400593). When a metal circuit layer is provided on the surface of the substrate in this manner, in order to prevent corrosion of the metal wiring by the electrolyte solution and to prevent reverse electron transfer from the metal circuit layer to the electrolyte solution, it is necessary for at least surface of the metal circuit layer to be protected by some type of shielding layer. This shielding layer must cover the surface of the substrate completely.

FIGS. 26A and 26B show an example of a dye-sensitized solar cell. This dye-sensitized solar cell is provided with a working electrode 63 that is formed on top of an electrode substrate 61 by fine particles of an oxide semiconductor such as titanium oxide and that has an oxide semiconductor porous film 62 that is provided with a photo-sensitizing dye, and with a counter electrode 64 that is provided opposite this working electrode 63. An electrolyte layer 65 is formed between the working electrode 63 and the counter electrode 64 by filling this space with an electrolyte solution.

The electrode substrate 61 is constructed by forming a transparent conductive layer 611 that is made of tin-doped indium oxide (ITO), fluorine-doped tin oxide (FTO), or the like on a base material 610 that is a glass plate or the like. In order to improve the current collecting efficiency from the oxide semiconductor porous film 62, a lattice-shaped metal circuit layer 612 that is made of gold, platinum, silver, or the like is provided on the transparent conductive layer 611. Furthermore, in order to restrict problems such as output deteriorations caused by corrosion of the metal circuit layer 612 or by short-circuiting with the electrolyte layer 65 or by leak current (i.e., reverse electron transfer), and the like, the surfaces of the metal circuit layer 612 and the transparent conductive layer 611 are covered by a shielding layer 613 that is made of an oxide semiconductor such as ITO, FTO, titanium oxide, zinc oxide, or the like. Instead of the electrolyte layer 65, it is also possible to use a solid charge transfer layer 66 that is made of a p-type semiconductor or the like. When light such as sunlight enters from the base material 610 side, electromotive force is generated between the working electrode 63 and the counter electrode 64.

The formation of the shielding layer 613 is achieved by forming a film made up of an oxide semiconductor on the metal circuit layer 612 using a thin film forming method such as a sputtering method, a spray thermal decomposition method (SPD), or the like. However, because the surfaces of the transparent conductive layer 611 and the metal circuit layer 612 present profiles having minute bumps and irregularities such as voids, cracks, and particle boundaries, it is difficult for a dense shielding layer 613 to be formed uniformly, and there are cases in which uncovered portions in which the metal circuit layer 612 is exposed are generated by incomplete formation of the shielding layer 613. In this case, there is a reduction in the ability to suppress problems such as deteriorations in output that are caused by corrosion of the metal circuit layer 612, or that are caused by the generation of leak current due to reverse electron transfer from the metal wiring last 612 to the electrolyte layer 65, and the characteristics of the solar cell may be considerably impaired.

If the thickness of the coating of the shielding layer 613 is increased in order to suppress incomplete formation of the shielding layer 613, the transfer of photo electrons may be inhibited, and there is a reduction in the photo transmittance so that, contrary to expectations, there is a possibility that the photoelectric conversion efficiency will be reduced.

For example, when the metal circuit layer 612 is formed using a conductive paste that includes conductive particles such as fine metal particles and a bonding agent such as glass frit as the main components, from the viewpoint of the conductivity of the metal circuit layer 612, it is preferable that the compounding ratio of the bonding agent be low, however, minute and sharp bumps and irregularities and shadow portions such as voids and pinholes tend to be generated on the interior and surface of the metal circuit layer 612, so that forming a shading layer is difficult. If the compounding ratio of the bonding agent is increased, there may be a reduction in the conductivity of the metal circuit layer 612. Because of this, there may be a reduction in the current collecting efficiency, and the cell characteristics may be impaired markedly.

If the metal circuit layer 612 is not provided on the electrode substrate 61, and an attempt is made to collect current from the oxide semiconductor porous film 62 using only the transparent conductive layer 611, because the specific resistance of the FTO semiconductor or the like that forms the transparent conductive layer 611 is about $10^{-4}$ to $10^{-3}$ Ω·cm, which is about 100 times greater than the specific resistance of metals such as silver or gold, there is a significant reduction in the photoelectric conversion efficiency, particularly in the case of a cell having a large surface area. If the thickness of the transparent conductive layer 611 is increased in order to lower the resistance thereof, there is a marked deterioration in the light transmittance of the transparent conductive layer 611, and, once again, the photoelectric conversion efficiency is reduced.

As viewed in a direction along the side on which films are deposited, if there are portions that casts shadows on the metal surface of the substrate (for example, undercut of the circuit wall surface or the like), some portions may not be covered by the shading layer. Because these tend to cause corrosion of the circuit and reverse electron transfer to the electrolyte solution and the like, the cell characteristics may be impaired markedly. In particular, a sputtering method or a spray thermal decomposition (SPD) method is preferably used as the method for forming a commonly-used film such as FTO, ITO, $TiO_2$ or the like as the shading layer, however, in these methods, it is extremely difficult to form a film uniformly on shadow portions. For example, if a circuit is formed using an additive plating method, in some cases the circuit wall surface is formed in a tapered shape due to the characteristics of the plating resist. If the bottom portion of the resist pattern remains like a trail, this portion becomes an undercut after the circuit has been formed. In this manner, it becomes difficult to form a thin film of a dense shielding layer on the surface of a metal circuit.

If an attempt is made to maintain an opening area ratio that does not considerably impair the light transmittance while providing a satisfactory conductivity, it is necessary for the metal circuit layer to have a certain height. Accordingly, when forming the metal circuit layer, the substrate surface has a large number of bumps and irregularities. Because of this, problems arise such as, for example, film thickness uniformity being reduced in the formation of a semiconductor porous film for a dye solar cell, and cracking or peeling of the film may arise in the portions in which the bumps and irregularities are located.

For example, in the case of a circuit formed by printing a paste whose main components are conductive particles and a glass frit binder, and then baking the circuit at about 500° C., because the compounding ratio of the glass frit is reduced in order that the fusion between conductive particles is not hindered and a high conductivity can be obtained, typically, abrupt bumps and irregularities or shadows such as voids and pinholes are generated on the surface or interior of the coated film, and it becomes extremely difficult to form a shading layer. Conversely, if the compounding ratio of the glass frit, which forms a binder, is increased in order to suppress these types of defects in the coated film surface, there is a marked reduction in the conductivity of the coated film, and there is a tendency for the circuit to not exhibit its normal functions.

As shown in FIG. 27, a transparent conductive film 72 having a thickness of about 1 μm is made of indium-doped tin oxide (ITO) or fluorine-doped tin oxide (FTO) or the like on the entire surface of a glass plate shown by reference numeral 71, so as to form conductive glass 73. An oxide semiconductor porous film 74, which is sensitized with a photo-sensitizing dye and includes minute particles of an oxide semiconductor such as titanium oxide, niobium oxide or the like, is formed on top of the transparent conductive film 72 of this conductive glass 73. Reference numeral 75 denotes a conductive glass that is to be a counter electrode. An electrolyte layer 76 is formed by filling the space between the counter electrode 75 and the oxide semiconductor porous film 74 with an electrolyte solution of a non-aqueous solution that contains a redox couple such as iodine and iodide ions. Instead of the electrolyte layer 76, it is also possible to provide a hole transporting layer made of a solid p-type semiconductor such as copper iodide, copper thiocyanate, or the like. In this dye-sensitized solar cell, when light such as sunlight enters from the conductive glass 73 side, electromotive force is generated between the transparent conductive film 72 and the counter electrode 75.

In an actual dye-sensitized solar cell, because a circuit electrode is formed on a transparent conductive film, and an oxide semiconductor porous film is provided on top of that, and the space between them is filled with an electrolyte solution that contains iodine or the like, the circuit electrode contacts the electrolyte solution via the oxide semiconductor porous film. As a result, there are cases in which leak current arises due to electrons flowing reversely from the circuit electrode to the electrolyte solution. This occurs because, when comparing the energy levels of the circuit electrode with that of the electrolyte solution, the energy level of the electrolyte solution is lower. Therefore, currently, leak current is obstructed by the formation of a barrier layer that is made up of a semiconductor material or an insulating material at an interface between the electrode circuit and the electrolyte solution. However, because the barrier layers are formed with a variety of film forming methods, the problem of pinhole arises. Therefore, methods for solving this pinhole problem are being investigated, however, in this case, it is extremely important for practical reasons that the manufacturing method is an inexpensive one in which the cost is increased greatly (see Published Japanese Translation No. H08-15097 of the PCT International Application).

DISCLOSURE OF INVENTION

An electrode substrate of the present invention includes a metal circuit layer and a transparent conductive layer that are formed on a base material. The metal circuit layer is electrically connected to the transparent conductive layer. At least the surface of the metal circuit layer is covered by an insulating layer.

According to this electrode substrate, it is ensured that the metal circuit layer is shielded from an electrolyte solution and the like, and corrosion thereof and leak current can be effectively prevented. Thus, the electrode substrate exhibits excellent conductivity.

The insulating layer is preferably made of a material that contains a glass component, and is particularly preferably formed by printing a paste that contains glass frit. By this, it is possible to easily form an insulating layer that reliably insulates and shields the metal circuit layer.

Preferably, the metal circuit layer is formed using a printing method. By this, a metal circuit layer having a desired pattern can be easily formed.

A photoelectric conversion element or dye-sensitized solar cell of one aspect of the present invention includes the above-described electrode substrate. By this, reduction outputs caused by corrosion or leak current of the metal circuit layer of the electrode substrate are suppressed, and the photoelectric conversion efficiency is improved.

An electrode substrate of another aspect of the present invention includes a metal circuit layer and a transparent conductive layer on a transparent substrate, and the metal circuit layer includes at least two layers, namely, an inner layer and an outer layer.

Preferably, the outer layer is formed using a printing method. Preferably, the volume resistivity of the inner layer is smaller than the volume resistivity of the outer layer. Preferably, the outer layer is formed using a paste composition that contains at least conductive particles and a binder material, and that a compounding ratio of binder material in the paste composition is greater than the compounding ratio of a binder material in compositions that is used for other layers in the metal circuit layer.

Preferably, the composition that is used to form the above-described metal circuit layer contains silver or nickel. It is also possible for a shielding layer to be provided on the surface of the conductive layer including the metal circuit layer and/or the transparent conductive layer.

A photoelectric conversion element or dye-sensitized solar cell of another aspect of the present invention includes the above-described electrode substrate.

An electrode substrate of another aspect of the present invention includes a metal circuit layer and a transparent conductive layer on a transparent substrate. The metal circuit layer is formed along a wire pattern that has been machine grooved in the transparent substrate. At least a portion of the metal circuit layer is below surface of the transparent substrate.

Preferably, at least the surface of the metal circuit layer is covered by the shielding layer. Preferably, the shielding layer contains at least one selected from the group consisting of a glass component, a metal oxide component, and an electrochemically inert resin component.

A photoelectric conversion element or dye-sensitized solar cell of the present invention includes the above-described electrode substrate.

A conductive glass substrate of another aspect of the present invention includes a glass plate provided with a transparent conductive film, a conductive circuit layer that is provided on the glass plate and is made of a metal having a catalyst action with a metal that easily form a passive state, or a metal to be substituted with the metal that easily form a passive state, or a material containing such a metal, and an insulating circuit protective layer that is formed on the conductive circuit layer. A metal that easily form a passive state is provided in pinhole portions that are present in the circuit protective layer.

The opening area ratio of the conductive circuit layer is preferably 75% or more, and may be 90 to 99%. This applies to all of the embodiments.

The conductive circuit layer may also be formed using a conductive paste containing at least one metal selected from the group consisting of gold, silver, platinum, palladium, copper, and aluminum.

It is also possible for the insulating circuit protective layer to be formed using an insulating paste.

It is also possible for the metal that easily form a passive state to be formed by an electroless metal plating process. It is also possible for the electroless metal plating process to be electroless nickel plating, electroless cobalt plating, or electroless tin plating.

A dye-sensitized solar cell of another aspect of the present invention includes the above-described glass substrate.

A method for manufacturing a conductive glass substrate of one aspect of the present invention includes forming a transparent conductive layer on a surface of a glass plate; forming a conductive circuit layer on the transparent conductive layer by plating or screen printing using a metal having a catalyst action with a metal that easily form a passive state, or a metal to be substituted with the metal that easily form a passive state, or a material containing such a metal; and forming a circuit protective layer on the conductive circuit layer using an insulating paste; and forming the metal that easily form a passive state by an electroless metal plating process of nickel, cobalt, or tin.

An electrode substrate of another aspect of the present invention includes: a base material; a metal circuit layer that is provided on the base material; and a transparent conductive layer that is electrically connected to the metal circuit layer. The metal circuit layer is covered and insulated by an insulating layer that includes a heat-resistant ceramic as a main component.

As the heat-resistant ceramic, a ceramic that contains at least one of alumina, zirconia, and silica may be used.

As the insulating layer, one that contains as a binder at least one of silicate, phosphate, colloidal silica, alkyl silicate, and metal alkoxide may be used. Preferably, the insulating layer is formed using a printing method. Preferably, the metal circuit layer is formed using a printing method.

It is also possible for at least a portion of the metal circuit layer to be positioned within a concave portion that is defined in a surface of the base material.

A photoelectric conversion element and a dye-sensitized solar cell of another aspect of the present invention include the above-described electrode substrate.

According to the above-described electrode substrate, a metal circuit layer can be reliably shielded, and problems of corrosion of the metal circuit layer as well as deterioration of the electrolyte due to contact with the metal included in the metal circuit layer, and the problem of leak current can be solved. It is thus possible for the electrode substrate to function excellently as a highly conductive transparent electrode substrate. By this, in a cell having a large surface area, such as, for example, 100 mm square, the photoelectric conversion efficiency is increased compared with a cell having a substrate without wiring.

BRIEF DESCRIPTION THE DRAWINGS

BEST MODE FOR CARRYING OUT THE INVENTION

Preferred embodiments of the present invention will now be described with reference made to the drawings. It should be noted, however, that the present invention is not limited by these embodiments, and various combinations of component elements of these embodiments may be applied where appropriate.

Figure 1A:
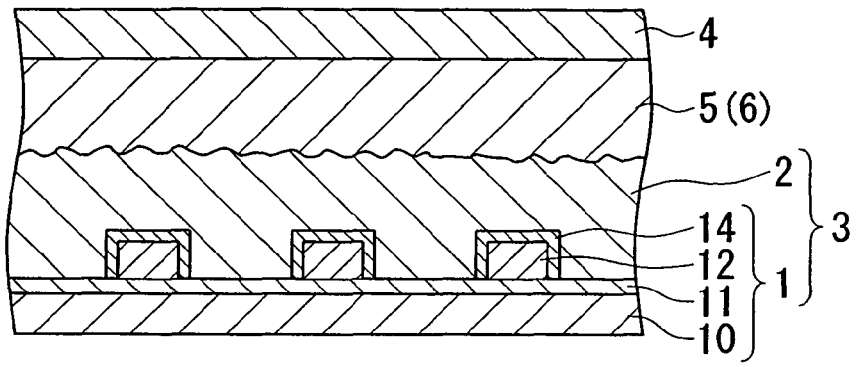
FIG. 1A is a cross-sectional view showing an embodiment of the photoelectric conversion element of the present invention.
Figure 1B:
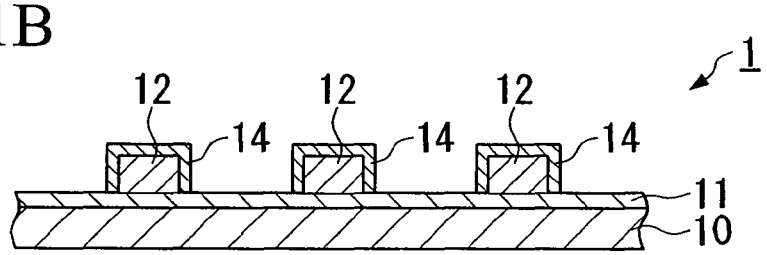
FIG. 1B is a cross-sectional view showing an example of an electrode substrate.

FIG. 1A is a cross-sectional view showing an example of the photoelectric conversion element of the present invention, while FIG. 1B is a cross-sectional view showing an electrode substrate 1 that is used in this photoelectric conversion element.

This photoelectric conversion element is a dye-sensitized solar cell in which, when light such as sunlight enters this photoelectric conversion element from a base material 10 side, electromotive force is generated between a working electrode 3 and a counter electrode 4, enabling power to be obtained.

As shown in FIG. 1B, in the photoelectric conversion element of this embodiment, an electrode substrate 1 includes a transparent conductive layer 11 that is formed on the base material 10, a metal circuit layer 12 that is formed on the transparent conductive layer 11, and an insulating layer 14 that covers only the surface of the metal circuit layer 12. The entire surface of the metal circuit layer 12 other than the bottom surface thereof is covered by the insulating layer 14. In this embodiment, the insulating layer 14 is not formed on the surface of the transparent conductive layer 11 between adjacent metal circuit layers 12.

Preferably, the material used for the base material 10 has a high light transmittance in actual use. Specifically, glass; transparent plastic sheets such as polyethylene terephthalate (PET), polyethylene naphthalate (PEN), polycarbonate (PC), polyether sulfone (PES) and the like; and polished ceramic plates of titanium oxide, alumina and the like, may be used.

The transparent conductive layer 11 is formed on the base material 10 extending over an area that is wider than the region in which the metal circuit layer 12 is formed. The material of the transparent conductive layer 11 is not particularly limited, and examples of conductive metal oxides include tin-doped indium oxide (ITO), tin oxide ($SnO_2$), fluorine-doped tin oxide (FTO) and the like.

A method that is suitable for the material of the transparent conductive layer 11 may be used as the method for forming the transparent conductive layer 11. Examples thereof include a sputtering method, an evaporation method, an SPD method, a CVD method or the like. In consideration of the light transmittance and the conductivity, the transparent conductive layer 11 is typically formed with a film thickness of about 0.001 μm to 10 μm. However, the present invention is not limited to this range.

Figure 2:
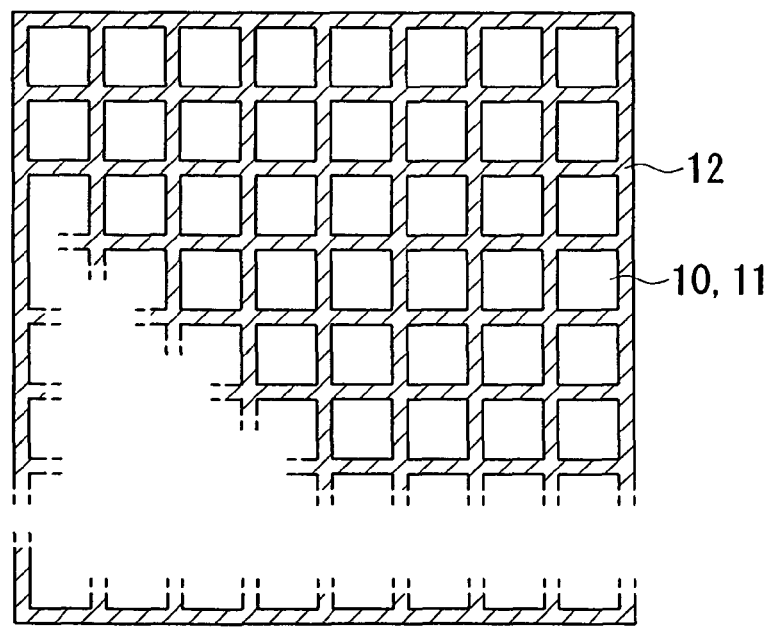
FIG. 2 is a plan view showing an example of a metal circuit layer.

The metal circuit layer 12 is made of a metal such as gold, silver, platinum, aluminum, nickel, titanium, or the like, and is formed as wiring in a pattern such as the lattice pattern shown in FIG. 2, a stripe pattern or a comb pattern. Preferably, the wiring width of the metal circuit layer 12 is 1000 μm or less in order that the light transmittance of the electrode substrate 1 is not significantly impaired. The thickness of each wire of the metal circuit layer 12 is not particularly limited, however, it is preferably between 0.1 μm and 10 μm.

Examples of the method used to form the metal wiring 12 include a method in which a paste is prepared by mixing metal particles that are to be conductive particles with a bonding agent such as fine glass particles, and coating this so as to form a predetermined pattern using a printing method such as a screen printing method, a metal mask method, or an inkjet method, and then heating the substrate so as to bake it and make the conductive particles fused. If the base material 10 is, for example, glass, the baking temperature is preferably 600° C. or lower, and more preferably 550° C. or lower. In addition, a formation method such as a sputtering method, an evaporation method, and a plating method may be used.

From the viewpoint of conductivity, the volume resistivity of the metal circuit layer 12 is preferably $10^{-5}$ Ω·cm or lower. Preferably, the surface of the metal circuit layer 12 is smooth, however, it is acceptable if a small amount of protrusions or irregularities or the like are present.

The insulating layer 14 is formed using one or a plurality of insulating materials such as resins, ceramics, or glass in the form of either one layer or a plurality of layers overlapping the regions in which the metal circuit layer 12 has been formed. The region in which the insulating layer 14 is formed may also extend beyond the periphery of the pattern on the metal circuit layer 12 provided that there is no serious obstruction to incident light or to the charge transfer towards the transparent conductive layer 11.

The method for forming the insulating layer 14 is not necessarily limited. For example, a glass paste prepared by mixing an appropriate thickening agent, bonding agent, dispersion agent, solvent, or the like with glass frit may be coated using a printing method such as a screen printing method, a metal mask method, an inkjet method, or the like overlapping the pattern of the metal circuit layer 12. This is then heated and baked. This method is preferable from the viewpoints of the ease of forming a pattern and its low cost. The baking temperature is preferably 600° C. or lower, and more preferably 550° C. or lower.

Glass that is capable of being baked at such temperatures and may be used here includes amorphous or crystalline glass such as commercially available lead based solder glass such as lead oxide based glass, lead borate based glass, and lead borate bismuth based glass, as well as non-lead based solder glass. There may be one insulating layer 14 or a plurality of insulating layers 14. If there are a plurality of insulating layers 14, the same type of glass paste may be used two or more times to form the layers, or two or more types of glass paste that have different melting temperatures may be used.

An oxide semiconductor porous film 2 in which a sensitizing dye is provided is formed on a surface of the electrode substrate 1, and an acting electrode 3 of the photoelectric conversion element is defined by the electrode substrate 1 and the oxide semiconductor porous film 2.

The oxide semiconductor porous film 2 is made of oxide semiconductor fine particles having an average particle size of 1 to 1000 nm of one or more of titanium oxide ($TiO_2$), tin oxide ($SnO_2$), tungsten oxide ($WO_3$), zinc oxide (ZnO), and niobium oxide ($Nb_2O_5$). The oxide semiconductor porous film 2 is a porous thin film that may have a thickness of, for example, about 0.5 to 50 μm, however, the thickness is not limited to this range.

The oxide semiconductor porous film 2 can be formed, for example, by employing methods such as a method in which a dispersion solution that is obtained by dispersing commercially available oxide semiconductor fine particles in a desired dispersion medium, or a colloid solution that can be prepared using a sol-gel method is coated, after optionally desired additives have been added thereto, using a known coating method such as a screen printing method, an inkjet printing method, a roll coating method, a doctor blade method, a spin coating method, a spray coating method, or the like. Other methods include: a migration electrodeposition method in which the electrode substrate 1 is immersed in a colloid solution and oxide semiconductor fine particles are made to adhere to the electrode substrate 1 by electrophoresis; a method in which a foaming agent is mixed in a colloid solution or dispersion solution which is then coated and baked so as to form a porous material; and a method in which polymer microbeads are mixed together and coated, and these polymer microbeads are then removed by thermal treatment or chemical treatment, so as to define spaces and thereby form a porous material.

The sensitizing dye that is provided in the oxide semiconductor porous film 2 is not particularly limited. For example, the dye that is used can be appropriately selected according to the application and the material of the oxide semiconductor porous film. Examples include ruthenium complexes and iron complexes having ligands that include bipyridine structures, terpyridine structures, and the like; metal complexes such as porphyrin systems and phthalocyanine systems; as well as organic dyes such as eosin, rhodamine, and melocyanine.

For the electrolyte solution that is used for the electrolyte layer 5, it is possible to use an organic solvent that contains a redox pair or room temperature molten salt. Examples of the organic solvent include acetonitrile, methoxy acetonitrile, propionitrile, ethylene carbonate, propylene carbonate, diethyl carbonate, and γ-butyrolactone. Examples of the room temperature molten salt include salts made of quaternary imidazolium based cations and iodide ions or bistrifluoromethyl sulfonylimido anions, and the like.

The redox pair that is contained in the electrolyte solution is not particularly limited. For example, pairs such as iodine/iodide ions, bromine/bromide ions, and the like may be used. For the supply source of iodide ions or the bromide ions, a lithium salt, a quaternary imidazolium salt, a tetrabutylammonium salt, and the like may be used alone or in a combination.

Additives, such as tert-butylpyridine and the like, can be added if necessary to this electrolyte solution. It is also possible to use an electrolyte solution whose fluidity has been suppressed by the addition thereto of an appropriate gelling agent so as to make the electrolyte solution to form a gel.

Instead of the electrolyte layer 5, it is also possible to use a solid charge transfer layer 6 that is made of a p-type semiconductor or the like. As the p-type semiconductor, it is preferable to use, for example, monovalent copper compounds such as copper iodide, copper thiocyanide and the like. The method for forming the charge transfer layer 6 is not particularly limited, and any known method may be used. Examples thereof include a casting method, a sputtering method, and an evaporation method. It is also possible for this charge transfer layer 6 to contain additives where these are necessary for layer formation.

As the counter electrode 4 it is possible to use an electrode obtained by forming a thin film made up of a conductive oxide semiconductor such as ITO or FTO on a substrate made of an insulating material such as glass. Alternatively, the counter electrode 4 may be obtained by forming an electrode by evaporating or coating a conductive material such as gold, platinum, or a carbon based material on a substrate. It is also possible to use an electrode obtained by forming a layer such as platinum or carbon on a thin film of a conductive oxide semiconductor such as ITO or FTO.

Examples of a method for manufacturing such a counter electrode 4 include a method in which a platinum layer is formed by first coating a solution of $H_2PtCl_6$ and then performing thermal treatment thereon. Alternatively, an electrode can be formed on a substrate using an evaporation method or a sputtering method.

If the charge transfer layer 6 is used instead of the electrolyte layer 5, it is possible to employ a method in which a layer is formed by forming directly a conductive material that will form the counter electrode 4 on the charge transfer layer 6 by sputtering or coating.

According to the electrode substrate of this embodiment, because the transparent conductive layer 11 and the metal circuit layer 12 are in contact and are electrically connected, electrons from the oxide semiconductor porous film 2 are collected by the transparent conductive layer 11, and it is possible to further increase the collecting efficiency via the metal circuit layer 12. The metal circuit layer 12 is securely shielded from the solution of the electrolyte layer 5 or the like, and it is possible to effectively prevent the metal circuit layer 12 from corroding and to restrict leak current. Accordingly, because the electrode substrate 1 can be provided with excellent conduction characteristics, by forming a working electrode of a photoelectric conversion element using an electrode substrate of this embodiment, contact between the metal circuit layer 12 and the electrolyte layer 5 is prevented, reduction outputs caused by corrosion or leak current are suppressed, and it is possible to manufacture a photoelectric conversion element having a high photoelectric conversion efficiency.

Figure 3:
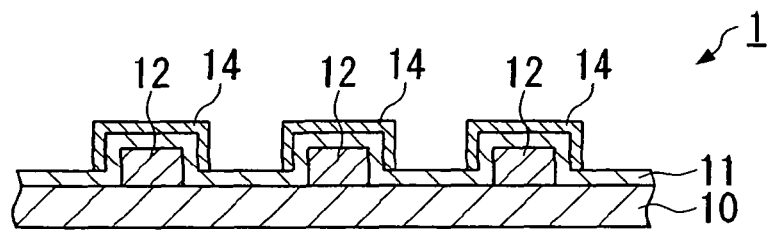
FIGS. 3 to 7 are cross-sectional views showing other embodiments of the electrode substrate of the present invention.

FIG. 3 is a schematic cross-sectional view showing a second embodiment of the electrode substrate of the present invention. In the electrode substrate 1 of this example, the metal circuit layer 12 is provided on the base material 10, and the transparent conductive layer 11 is formed over the metal circuit layer 12 while extending across an area that is wider than the region in which the metal circuit layer 12 is formed. The insulating layer 14 is formed on the transparent conductive layer 11 overlapping the pattern of the metal circuit layer 12 so as to cover top surfaces and side surfaces of the metal circuit layer 12. In other words, the insulating layer 14 is provided on the metal circuit layer 12 via the transparent conductive layer 11.

According to this type of electrode substrate 1, in the same manner as the electrode substrate 1 of the above-described first embodiment, because the metal circuit layer 12 is insulated and shielded by the insulating layer 14, it is possible to suppress the generation of leak current and to manufacture an electrode substrate 1 having excellent conduction characteristics. It is possible, using this electrode substrate 1 as well, to manufacture a photoelectric conversion element having a high degree of photoelectric conversion efficiency.

Other embodiments of the electrode substrate of the present invention will now be shown.

Figure 4:
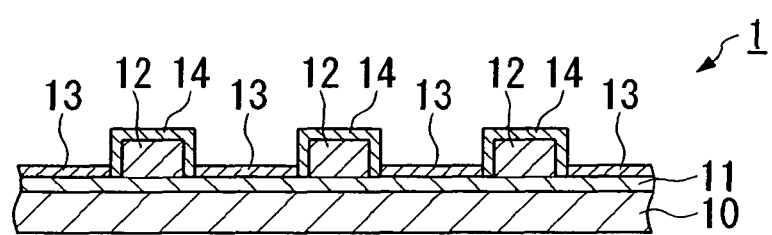

In the embodiment shown in FIG. 4, the transparent conductive layer 11 is formed on top of the base material 10, and the metal circuit layer 12 is formed in a pattern such as a lattice pattern on the transparent conductive layer 11. A shielding layer 13 that is a thin film of an oxide semiconductor is provided on the transparent conductive layer 11, and the insulating layer 14 is formed on the metal circuit layer 12.

Figure 5:
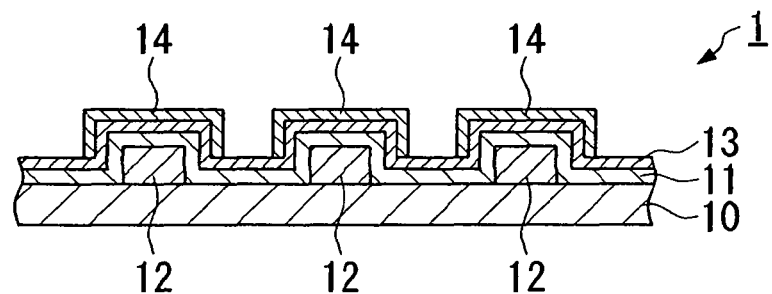

In the embodiment shown in FIG. 5, the metal circuit layer 12 is formed in a pattern such as a lattice pattern on the base material 10, and the transparent conductive layer 11 is formed on the metal circuit layer 12 so as to extend across an area that is wider than the region in which the metal circuit layer 12 is formed. The shielding layer 13 that is a thin film of an oxide semiconductor is provided on the transparent conductive layer 11. Furthermore, the insulating layer 14 is formed on the shielding layer 13 overlapping the pattern of the metal circuit layer 12 so as to cover the top surfaces and side surfaces of the metal circuit layer 12.

Although less significant than the case of the metal circuit layer 12, it has been indicated that reverse electron transfer from the transparent conductive layer 11 is occurring. Therefore, as shown in FIG. 4 and FIG. 5, by providing the shielding layer 13 on the transparent conductive layer 11, it is possible to obtain a greater shielding effect.

For the material of the shielding layer 13, a compound may be selected whose electron transfer reaction rate with an electrolyte solution that contains redox species is slow, and that has a high light transmittance and photoelectron transferring ability. Examples thereof include titanium oxide, zinc oxide, niobium oxide, tin oxide, fluorine-doped tin oxide (FTO), tin-doped indium oxide (ITO), and the like.

It is necessary for the shielding layer 13 to be formed thinly enough to not inhibit the transfer of electrons to the transparent conductive layer 11, and a thickness of about 10 to 3000 nm is preferable. Examples of methods for forming the shielding layer 13 include a sputtering method, an evaporation method, an SPD method, a spin coating method, a dipping method, and a doctor blade method. However, in these methods, the denseness of the shielding layer 13 and its adaptability to the surface configuration of the base material 10 may not necessarily be satisfactory, and it is difficult to obtain a sufficient shielding performance in the shielding of the metal circuit layer 12. Therefore, when forming the shielding layer 13 as well, it is necessary to form the insulating layer 14 either directly or via the transparent conductive layer 11 and shielding layer 13 and the like on the metal circuit layer 12. This enables the insulation and shielding of the metal circuit layer 12 to be achieved satisfactorily.

The method used to form the shielding layer 13 is not particularly limited, and examples thereof include forming a film of an oxide semiconductor which is the desired compound or a precursor thereof by performing a dry method (i.e., a vapor phase method) such as a sputtering method, an evaporation method or a CVD method. For example, when a film is being formed using a precursor of a metal or the like, the shielding layer 13 can be obtained by oxidizing the precursor using thermal treatment or chemical treatment.

If a wet method is used, after a solution that contains the desired compound or a precursor thereof has been coated using a method such as a spin coating method, a dipping method, or a blade coating method, the solution is chemically changed into the desired compound by thermal treatment or chemical treatment. Thus, the shielding layer 13 can be obtained. Examples of the precursor include salts and complexes having constituent metallic elements of the desired compound. In order to obtain a more dense film, a solution is more preferable than a dispersion.

Other methods may be used to form the shielding layer 13 such as, for example, a spray thermal decomposition method (SPD) in which the shielding layer 13 is formed by heating the base material 10 having the transparent conductive layer 11, and spraying a substance for forming a precursor of the shielding layer 13 onto the substrate 10 so as to thermally decompose it and change it into the desired oxide semiconductor.

In this manner, because it is possible to suppress the reverse transfer of electrons from the transparent conductive layer 11 by providing the shielding layer 13 that shields the transparent conductive layer 11, it is possible by using the electrode substrate of this embodiment to manufacture a photoelectric conversion element having a high degree of photoelectric conversion efficiency.

It is possible, if so required by the characteristics thereof, to impart the shielding layer 13 with the properties of a protective layer that is provided, for example, for a different purpose than that of the insulating layer 14.

Figure 6:
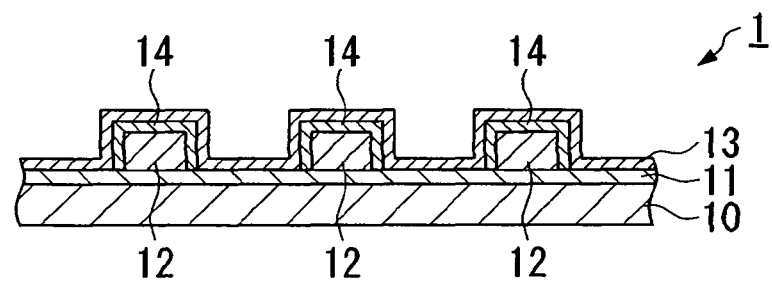

For example, in the embodiment shown in FIG. 6, the shielding layer 13 is formed not only on the transparent conductive layer 11, but also above the metal circuit layer 12 and the insulating layer 14. Consequently, the shielding layer 13 can also be used as a protective layer for protecting the metal circuit layer 12 and the insulating layer 14.

Figure 7:
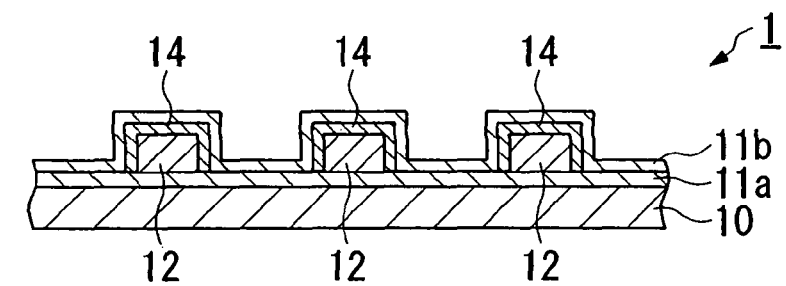

In the electrode substrate 1 of the embodiment shown in FIG. 7, the metal circuit layer 12 is formed in a wiring pattern such as a lattice pattern, a stripe pattern, or a comb pattern on a first transparent conductive layer 11a, and the insulating layer 14 is provided on top of the metal circuit layer 12 so as to cover the metal circuit layer 12. Furthermore, a second transparent conductive layer 11b is formed above top of the metal circuit layer 12 and the insulating layer 14. In other words, the metal circuit layer 12 and the insulating layer 14 are sandwiched between the first transparent conductive layer 11a and the second transparent conductive layer 11b. The first and second transparent conductive layers 11a and 11b are the same as the above-described transparent layer 11, and are thin films made of conductive metal oxides such as ITO and FTO.

According to the electrode substrate 1 having such a structure, the insulation and shielding of the metal circuit layer 12 is provided by the insulating layer 14, and the metal circuit layer 12 and the insulating layer 14 are protected by the second transparent conductive layer 11b. By providing the second transparent conductive layer 11b in conjunction with the first transparent conductive layer 11a, an improvement in the current collecting efficiency can be expected.

The electrode substrate of this embodiment can also be applied to photoelectric conversion elements other than those of solar sells such as photochemical cells and optical sensors. In this case as well, the metal circuit layer 12 of the electrode substrate 1 is covered by the insulating layer 14, so that contact with the metal circuit layer 12 by the electrolyte solution is prevented. As a result, problems such as corrosion and short-circuiting are restricted, and deteriorations in quality as well as reductions in the photoelectric conversion performance and optical response and the like can be kept under control.

Examples corresponding to the above-described embodiment will now be given.

EXAMPLE A1

Manufacturing of an Electrode Substrate

A 100 mm×100 mm glass substrate provided with an FTO film was used as a transparent conductive layer 11 (11a) and the base material 10. A silver printing paste (having a volume resistivity after baking of $3\times10^{-6}\Omega$) was screen printed on the surface thereof in a lattice pattern. After 10 minutes of leveling, the paste was dried in a hot air circulating furnace at 135° C. for 20 minutes, and was then baked at 550° C. for 15 minutes so as to form the metal circuit layer 12 having a silver circuit. The circuit width of the metal circuit layer 12 was 150 µm, while the film thickness was 5 µm.

Glass paste was printed overlapping the metal circuit layer 12 by screen printing while alignment was conducted using a CCD camera. After 10 minutes of leveling, the paste was dried in a hot air circulating furnace at 135° C. for 20 minutes, and was then baked at 550° C. for 15 minutes so as to form the insulating layer 14. The width of the insulating layer 14 that was obtained was 250 µm, while the film thickness from the surface of the glass substrate was 10 µm. Accordingly, the insulating layer 14 was formed having a thickness of about 5 µm on the metal circuit layer 12.

When the surface of this insulating layer 14 was observed using a scanning electron microscope (SEM), it was found that glass frit particles had melted and were fused together, and that the surface of the insulating layer 14 was dense. No defects such as large pinholes or the like were observed.

Furthermore, an FTO film was formed by an SPD method as a second transparent conductive layer 11b, which functioned as both a protective layer and the shielding layer 13, so as to extend across the tops of the metal circuit layer 12 and the insulating layer 14. Accordingly, an electrode structure 1 having the structure shown in FIG. 6 and FIG. 7 was prepared.
(Manufacturing of a Photoelectric Conversion Element)

A dispersion aqueous solution of titanium oxide (having an average particle size of 25 nm) was coated on the electrode substrate 1 that was obtained. It was then dried, and heat treated for one hour at 450° C. As a result, an oxide semiconductor porous film 2 having a thickness of 10 µm was formed. It was then further immersed for eight hours in an ethanol solution of a ruthenium bipyridine complex (an N3 dye) so as to be sensitized with a dye. As a result, the working electrode 3 was prepared.

For the counter electrode 4, a platinum sputtered FTO glass electrode substrate was used. This counter electrode 4 and the working electrode 3 were positioned facing each other with a 50 µm thick thermoplastic polyolefin resin sheet interposed between the two as a spacer. The two electrodes 3 and 4 were then secured by heat-melting the resin sheet. At this time, a portion of the counter electrode 4 side was left open in order to define an electrolyte injection aperture. A methoxy acetonitrile solution that contained 0.5 M of an iodide salt and 0.05M of iodine as main components was then injected via this solution injection aperture so as to form the electrolyte layer 5. Next, peripheral portions and the solution injection aperture were fully sealed by an epoxy based sealing resin, and a silver paste was coated on a current collecting portion so as to prepare a photoelectric conversion element for use as a test cell.

When the photoelectric conversion characteristics of this test cell were evaluated using pseudo sunlight having an AM of 1.5, the conversion efficiency was 3.0%.

EXAMPLE A2

Manufacturing of an Electrode Substrate

A 100 mm×100 mm heat-resistant glass substrate was used as the base material 10. Using the same procedure as in Example A1, a metal circuit layer 12 having a circuit width of 50 µm and a film thickness of 5 µm was formed on the surface of the substrate using a silver printing paste. Next, an FTO film that was the transparent conductive layer 11 was formed on the metal circuit layer 12 by an SPD method. Furthermore, using the same procedure as in Example A1, the insulating layer 14 was formed by printing glass paste so that the insulating layer 14 corresponds to the pattern of the metal circuit layer 12. As a result, the electrode substrate 3 having the structure shown in FIG. 3 was manufactured.
(Manufacturing of a Photoelectric Conversion Element)

Using this electrode substrate 1, a photoelectric conversion element was manufactured for use as a test cell using the same procedure as in Example A1. When the photoelectric conversion characteristics of this test cell were evaluated using pseudo sunlight having an AM of 1.5, the conversion efficiency was 2.5%.

EXAMPLE A3

Manufacturing of Electrode Substrate

A 100 mm×100 mm glass substrate provided with an FTO film was used as the transparent conductive layer 11 and the base material 10. A metal circuit layer 12 with a gold circuit having a circuit width of 50 µm and a film thickness of 5 µm was formed on the surface of the transparent conductive layer 11 by an additive plating method. Next, using the same procedure as in Example A1, the insulating layer 14 was formed on top of the metal circuit layer 12 by printing glass paste so that the insulating layer 14 corresponds to the pattern of the metal circuit layer 12. As a result, the electrode substrate 1 having the structure shown in FIG. 1B was manufactured.
(Manufacturing of Photoelectric Conversion Element)

Using this electrode substrate 1, a photoelectric conversion element was manufactured for use as a test cell using the same procedure as in Example A1. When the photoelectric conversion characteristics of this test cell were evaluated using pseudo sunlight having an AM of 1.5, the conversion efficiency was 3.3%.

COMPARATIVE EXAMPLE A1

Manufacturing of Electrode Substrate

A 100 mm×100 mm heat-resistant glass substrate was used as the base material 10. Using the same procedure as in Example A1, a metal circuit layer 12 having a circuit width of 100 µm and a film thickness of 5 µm was formed on the surface of the substrate using a silver printing paste. Next, an FTO film to be used as the transparent conductive layer 11 and the shielding layer 13 was formed on the metal circuit layer 12 by the same procedure as that of Example A2. As a result, the electrode substrate 1 was manufactured.

(Manufacturing of Photoelectric Conversion Element)

Using the electrode substrate 1, a photoelectric conversion element was manufactured for use as a test cell by the same procedure as that in Example A1. When the electrolyte injected into this test cell was observed, while the color was blackish brown immediately after the injection, it changed after several minutes to being substantially transparent. The reason for this was thought to be that because the shielding of the silver circuit was insufficient, the $I_3^-$ ions in the electrolyte were reacting with the exposed silver and were reduced to $I^-$. When the photoelectric conversion characteristics of this test cell were evaluated using pseudo sunlight having an AM of 1.5, the conversion efficiency was 0.24%.

From this, it was found that, if the insulating layer 14 is not provided, the silver circuit is not sufficiently shielded, and there is a tendency for the photoelectric conversion efficiency of the photoelectric conversion element to be reduced.

COMPARATIVE EXAMPLE A2

Manufacturing of Electrode Substrate

A 100 mm×100 mm glass substrate provided with an FTO film was used as the transparent conductive layer 11 and the base material 10. A metal circuit layer 12 with a gold circuit having a circuit width of 50 µm and a film thickness of 5 µm was formed on the surface of the transparent conductive layer 11 by an additive plating method. Next, using the same procedure as in Example A2, an FTO film to be used as the transparent conductive layer 11 and the shielding layer 13 and having a film thickness of 300 nm was formed on the metal circuit layer 12. As a result, the electrode substrate 1 was manufactured.

When the surface of the electrode substrate 1 that was formed in this manner was observed using an SEM and analyzed with an EDX, undercut were observed that was considered to have been caused by the plating resist remaining like a trail at the bottom portion of the metal circuit layer 12 which resulted in the coating of FTO not being provided in shadow portions of this undercut.

(Manufacturing of Photoelectric Conversion Element)

Using this electrode substrate 1, a photoelectric conversion element was manufactured for use as a test cell by the same procedure as in Example A1. When the photoelectric conversion characteristics of this test cell were evaluated using pseudo sunlight having an AM of 1.5, the conversion efficiency was 0.30%. From this fact, it was found that if the insulating layer 14 is not provided and only the shielding layer 13 is provided to shield the conductive layer, the metal circuit layer 12 tends to be easily exposed. If the metal circuit layer 12 is exposed, there is a large deterioration in the photoelectric conversion efficiency of the photoelectric conversion element, which poses a problem.

COMPARATIVE EXAMPLE A3

Manufacturing of Electrode Substrate

A 100 mm×100 mm glass substrate provided with an FTO film was used as the transparent conductive layer 11 and the base material 10. The metal circuit layer 12 was not provided on the surface thereof, instead the glass substrate provided with the FTO film was used by itself as the electrode substrate 1, and a photoelectric conversion element was manufactured for use as a test cell using the same procedure as in Example A1. When the photoelectric conversion characteristics of this test cell were evaluated using pseudo sunlight having an AM of 1.5, the conversion efficiency was 0.11%. From this fact, it was found that if the metal circuit layer 12 is not provided, the photoelectric conversion efficiency of the photoelectric conversion element is reduced due to the high resistance of the electrode substrate 1.

Figure 8:
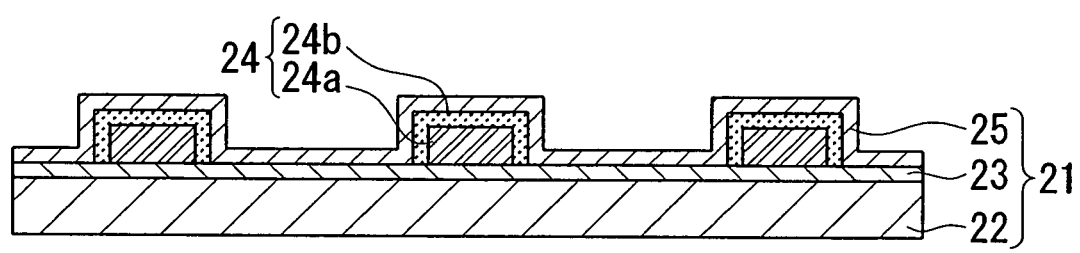
FIGS. 8 to 11 are cross-sectional views showing further embodiments of the electrode substrate of the present invention.
Figure 9:
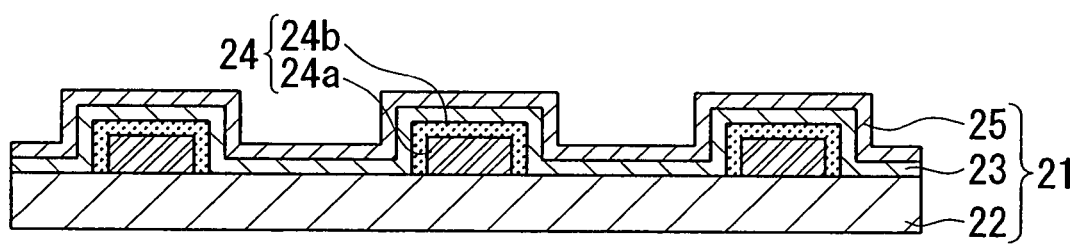

Electrode substrates of other embodiments of the present intention have a metal circuit layer and a transparent conductive layer on transparent substrate, and the metal circuit layer includes at least two layers, namely, an inner layer and an outer layer. Specifically, as shown in FIG. 8, a structure may be employed in which a metal circuit layer 24 is placed on top of a transparent conductive layer 23 that is formed on the entire surface of a transparent substrate 22. Alternatively, as shown in FIG. 9, a structure may be employed in which the transparent conductive layer 23 is formed on top of the transparent substrate 22 on which the metal circuit layer 24 has been placed. Reference numerals in FIG. 9 that are the same as those in FIG. 8 show elements that are the same as those of FIG. 8.

The material used for the transparent substrate 22 may be the same as that of the above-described substrate 10. A material having a high degree of light transmittance is preferable.

The material used to form the transparent conductive layer 23 may be the same as that used to form the above-described transparent conductive layer 11. Preferably, a suitable material having a high degree of light transmittance is selected in accordance with the combination of materials and their application.

As the method for forming the transparent conductive layer 23 on the transparent substrate 22, a suitable method may be selected from known methods such as, for example, a sputtering method and an evaporation method according to the material used to form the transparent conductive layer 23.

The material used to form the inner layer 24a of the metal circuit layer 24 is not particularly limited and, for example, gold, silver, platinum, aluminum, nickel, titanium, and the like may be used. Among these, silver and nickel are preferably used due to their comparative low cost when used as a general purpose printing paste, and their wide availability.

It is possible to add binder materials and suitable additives within an amount whereby they do not impair characteristics such as conductivity.

The method used to form the inner layer 24a of the metal circuit layer 24 is not particularly limited, and examples thereof include a printing method, a sputtering method, an evaporation method, a plating method, and the like, while, among these, a printing method is particularly preferable.

Preferably, the inner layer 24a that has been formed in this manner has a volume resistivity that is less than the volume resistivity of the outer layer 24b. In the present embodiment, it is preferable that the surface of the inner layer 24a is smooth, however, because this layer is formed, in accordance with the primary purpose, as the metal circuit layer 24 intended to lower the resistance of the electrode substrate 21, it is more important that it has a high level of conductivity. In contrast, the outer layer 24b, which is described below, is a conductive layer, however, because the primary purpose thereof is to smooth the wiring surface and make it easier to form the shielding layer 25, the outer layer 24b may have a higher volume resistance than the inner layer 24a.

Preferably, the volume resistivity of the inner layer 24a is at least $5\times10^{-5}$ Ω·cm or lower. Provided this condition is met, even if a small number of pinholes or cracks are generated in the coated film surface, because they are able to be corrected by the outer layer 24b, they pose no problem. If the inner layer 24a is provided in the metal circuit layer 24, it is also possible if so desired to form another layer that is different from the outer layer 24b inside or outside the inner layer 24a.

Preferably, the outer layer 24b of the metal circuit layer 24 is made using a paste composition that contains at least conductive particles and a binder material. The conductive particles are not particularly limited and examples thereof include silver, nickel, gold, and platinum. Among these, silver and nickel are preferably used due to their comparative low cost when used as a general purpose printing paste, and their wide availability.

The binder material is not particularly limited, however, when the binder is used, for example, in an electrode substrate 21 of a dye-sensitized solar cell, because the manufacturing steps include thermal treatment at about 400 to 500° C., it is preferable that a paste composition that can be baked such as, for example, glass frit is selected. The glass frit that is used for the binder material is not particularly limited provided that it is able to melt at or below the aforementioned baking temperature.

The compounding ratio of the binder material in the paste composition for forming the outer layer 24b is preferably greater than the compounding ratio of the binder material in the composition that forms other layers in the metal circuit layer 24. By adjusting the compounding ratio of the binder material in this manner, it is possible to inhibit the generation of large bumps and irregularities that may cast shadows when seen from the top surface, and to prevent pinholes and cracks being formed in the coated film surface of the outer layer 24b, thereby making the formation of the shielding layer 25 easier.

The compounding ratio of the binder material in the paste composition for forming the outer layer 24b is preferably 10% by weight or more with respect to conductive particles, and more preferably of 20% or more. However, because the conductivity of the film (i.e., of the outer layer 24b) deteriorates markedly as the compounding ratio of the binder material increases, a binder material compounding ratio that is low yet still as long as the surface conditions meet the above-described requirements is preferable, and a binder material compounding ratio of 90% or less is preferable, with 70% being even more preferable.

A printing method is preferable as the method for forming the outer layer 24b. Provided that a printing method is used there are no particular limitations and examples thereof include a screen printing method, an inkjet method, a metal mask method, and the like.

By forming the outer layer 24b using a printing method in this manner, because the surface roughness is low and cracks and pinholes are not generated, the surface of the metal circuit layer 24 is made smooth and the shielding layer 25 can be formed easily.

Furthermore, by using a printing method, it is possible to reduce manufacturing costs and improve the manufacturing efficiency.

The outer layer 24b in this specification is a printing layer that is formed using a printing method for the purposes described above, and does not necessarily have to be positioned on the outermost surface of the metal circuit layer 24. If necessary, other layers can be formed for various purposes on the outer side thereof.

If the thicknesses of the inner layer 24a and the outer layer 24b are compared, it is preferable that the thickness of the outer layer 24b does not exceed 100% of the thickness of the inner layer 24a. If the thickness of the outer layer 24b exceeds 100% of the thickness of the inner layer 24a, there is a reduction in the conductivity of the circuit per volume unit, and disadvantages tend to arise such as the circuit becoming too thick, or the conductivity being low.

If a baking step that is implemented, for example, in order to make conductive particles fused is required for either the inner layer 24a or the outer layer 24b, in consideration of their application to a glass substrate or the like, it is preferable that the required characteristics are obtained at a baking temperature of 600° C. or lower (and more preferably 550° C. or lower).

In the present embodiment, it is preferable to have the shielding layer 25 on the surface of a conductive layer including the metal circuit layer 24 and/or the transparent conductive layer 25.

The material used to form the shielding layer 25 is not particularly limited provided that it has a slow electron transfer reaction rate with an electrolyte solution that contains a redox pair with which it is in contact when it is used as a solar cell, and that it has a high light transmittance and does not inhibit the transfer of generated photoelectrons. Examples thereof include titanium oxide, zinc oxide, niobium oxide, tin oxide, fluorine-doped tin oxide (FTO), tin-doped indium oxide (ITO), and the like.

The method used to form the shielding layer 25 is not particularly limited, and examples thereof include forming a film of a desired compound or a precursor thereof by performing a dry method (i.e., a vapor phase method) such as a sputtering method, an evaporation method or a CVD method. For example, when a film is being formed using a precursor of a metal or the like, the shielding layer 25 can be formed by oxidizing the precursor using thermal treatment or chemical treatment.

If a wet method is used, after a solution obtained by dissolving or dispersing the desired compound or a precursor thereof has been coated using a method such as a spin coating method, a dipping method, or a blade coating method, the solution is chemically changed into the desired compound by thermal treatment or chemical treatment. Thus, the shielding layer 25 can be formed. Examples of the precursor include salts and complexes having constituent metallic elements of the desired compound. In order to obtain a more dense film (i.e., shielding layer 25), a dissolved solution is more preferable than a dispersion solution.

In the case of a spray decomposition method (SPD) or the like, the transparent substrate 22 having the transparent conductive layer 23 is heated, and a substance used as the precursor of the shielding layer 25 is sprayed thereon so as to thermally decompose it and change it into the desired oxide semiconductor. As a result, the shielding layer 25 is formed.

The thickness of the shielding layer 25 is not particularly limited, however, a thickness that is thin yet still exhibits an effect is preferable, and about 10 to 3000 mm is preferable.

In the electrode substrate 21 of the present embodiment, as shown in FIG. 9, in a structure in which, after the metal circuit layer 24 has been formed, the transparent conductive layer 23 is formed on a substrate, it is also possible for the transparent conductive layer 25 to function as the shielding layer 25.

As described above, because in the electrode substrate 21 of the present embodiment, portions that cast shadows such as pin holes or cracks are not generated in the surface of the outer layer 24b of the metal circuit layer 24, the surface of the outer layer 24b can be completely covered by the shielding layer 25.

Next, a description will be given of a dye-sensitized solar cell that uses the above-described electrode substrate 21.

The dye-sensitized solar cell of the present embodiment is provided with a working electrode that is formed on top of the above-described electrode substrate 21 and that is provided with a dye-sensitized oxide semiconductor porous film, and a counter electrode that is placed so as to face this working electrode. An electrolyte layer that contains a redox pair is provided between the working electrode and counter electrode.

Examples of the material used for the semiconductor porous film include titanium oxide ($TiO_2$), tin oxide (SnO2), tungsten oxide ($WO_3$), zinc oxide (ZnO), and niobium oxide ($Nb_2O_5$), and these may be used either alone or in a combination of two or more materials. It is also possible to obtain a material from commercially available minute particles or a colloid solution that is obtained by a sol-gel method.

A variety of coating methods may be used to form the semiconductor porous film such as, for example, coating a colloid solution or dispersion solution (containing additives where necessary) using a screen printing method, an inkjet printing method, a roll coating method, a doctor blade method, a spin coating method, and a spray coating method. In addition, migration electrode deposition of minute particles, a method in which a foaming agent is added, or a method in which polymer beads are used (subsequently only the molding component is removed) may be used.

For the dye that is provided in the semiconductor porous film, it is possible to use ruthenium complexes containing bipyridine structures, terpyridine structures, and the like in a ligand; metal complexes such as porphyrin and phthalocyanine; as well as organic dyes such as eosin, rhodamine, and melocyanine. There is no particular limitation and a dye that provides excitation behavior that is appropriate to the application and the semiconductor that is used can be selected.

For the electrolyte solution that is used for the electrolyte layer, it is possible to use a room temperature molten salt or an organic solvent that contains a redox pair. Examples of the organic solvent include acetonitrile, methoxy acetonitrile, propionitrile, propylene carbonate, diethyl carbonate, and γ-butyrolactone. Examples of the room temperature molten salt include salts made of quaternary imidazolium based cations and iodide ions or bistrifluoromethyl sulfonylimido anions, and the like.

It is also possible to use what is known as a "gel electrolyte" which is quasi-solidified and is obtained by adding a suitable gelling agent into the electrolyte solution.

The redox pair that is contained in the electrolyte solution is not particularly limited. For example, pairs such as iodine/iodide ions, bromine/bromide ions, and the like may be used. Specific examples of the former include combinations of iodide salts (i.e., lithium salt, quaternary imidazolium salt, tetrabutylammonium salt, and the like may be used alone or in a combination) and iodine. A variety of additives, such as tert-butylpyridine and the like, can be added if necessary to the electrolyte solution.

Instead of an electrolyte layer including an electrolyte solution, it is also possible to use a charge transfer layer that is made of a p-type semiconductor or the like. There are no particular limitations on the p-type semiconductor, and it is preferable to use, for example, monovalent copper compounds such as copper iodide, copper thiocyanide and the like. It is also possible for this charge transfer layer to contain a variety of additives where these are necessary for functionality or film formation.

The method for forming the charge transfer layer is not particularly limited, and examples thereof include film forming methods such as a casting method, a sputtering method, and an evaporation method.

The counter electrode may be formed, for example, by a method such as vapor deposition or sputtering of a carbon based material, platinum, or gold on a conductive or insulating substrate.

If a solid charge transfer layer is used, it is possible to employ a technique in which a layer is formed directly on the surface thereof by sputtering or coating or the like.

Because the dye-sensitized solar cell of the present embodiment has the electrode substrate 21, corrosion of the metal wiring by the electrolyte solution and reverse electron transfer from the metal circuit layer 24 to the electrolyte solution is inhibited, and the output of the photoelectric conversion element is improved even further.

Next, examples of the above-described embodiment will be given.

EXAMPLE B1

A silver paste (having silver particles 92:glass frit 8 by percent by mass) for forming the inner layer 24a was screen printed in a lattice pattern on the surface of a 100 mm×100 mm glass substrate provided with an FTO film. After 10 minutes of leveling, the paste was dried in a hot air circulating furnace at 135° C. for 20 minutes, and was then baked at 550° C. for 15 minutes. Next, a silver paste (having silver particles 55:glass frit 45 by percent by mass) for forming the outer layer 24b was printed overlapping the first printing while aligning using a CCD camera. After 10 minutes of leveling, the paste was dried in a hot air circulating furnace at 135° C. for 20 minutes, and was then baked at 550° C. for 15 minutes, so as to form a silver circuit. The circuit widths were 250 μm (the outer layer 24b) and 250 μm (the inner layer 24a), while the film thickness was 8 μm (the outer layer 3 μm+inner layer 5 μm).

A FTO of 300 nm thick was formed using a spray thermal decomposition method on the surface of the substrate provided with wiring that was formed in the above-described manner, thereby forming the shielding layer 25. This substrate was taken as electrode substrate (i).

When the surfaces of the inner layer 24a and the outer layer 24b of the silver circuit on the electrode substrate (i) were each observed using an SEM, portions in which the glass frit had not flowed into, namely, a large number of small holes of about 1 to 8 μm were observed on the surface of the inner layer 24a. On the surface of the outer layer 24b, substantially no small holes were observed, and a comparatively smooth film surface of 0.4 μm Ra was obtained.

A titanium oxide dispersion solution containing titanium oxide of an average particle size of 25 nm was coated on the electrode substrate (i) and dried, and then heated and baked at 450° C. for one hour. This was then immersed overnight in an ethanol solution of a ruthenium bipyridine complex (an N3 dye) so as to be sensitized with a dye. The substrate was positioned facing a platinum sputtered FTO substrate with a 50 μm thick thermoplastic polyolefin resin sheet interposed between the substrate plates. The two electrode plates were then secured by heat-melting the resin sheet. An electrolyte solution injection aperture was defined beforehand in the platinum sputtered electrode. A methoxy acetonitrile solution that contained 0.5 M of an iodide salt and 0.05M of iodine as main components was then injected between the two electrodes. Next, peripheral portions and the electrolyte solution injection aperture were fully sealed using an epoxy based sealing resin, and a silver paste was coated on a current collecting terminal portion so as to obtain a wired cell (i).

When the photoelectric conversion characteristics of this wired cell (i) were evaluated using pseudo sunlight having an AM of 1.5, the conversion efficiency thereof was 2.7%.

EXAMPLE B2

In the same procedures as in Example B1, a silver circuit was formed on a heat-resistant glass substrate, and an FTO film was formed on the surface. This electrode substrate (ii) was used as the transparent conductive layer 23 and also as the shielding layer 25.

Using this electrode substrate (ii), a wired cell (ii) was obtained in the same procedures as in Example B1. When the photoelectric conversion characteristics of this wired cell (ii) were evaluated using pseudo sunlight having an AM of 1.5, it was found that the conversion efficiency of wired cell (ii) was 2.5%.

EXAMPLE B3

A gold circuit was formed using an additive plating method on a 100 mm square FTO glass substrate. The gold circuit was formed in a lattice pattern on the surface of the substrate, and the circuit width was 50 μm. A printed silver circuit was printed on the gold circuit so as to form the outer layer 24b, and this was dried and baked in the same conditions as in Example B1. A silver paste having silver particles 55:glass frit 45 by percent by mass was used to give a film thickness of 8 μm (i.e., the outer layer 3 μm+inner layer 5 μm). A 300 nm FTO layer was formed on the surface thereof in the same procedures as in Example B1 to form the shielding layer 25, and thereby obtaining an electrode substrate (iii).

Using this electrode substrate (iii), a wired cell (iii) was obtained in the same procedures as in Example B1. When the photoelectric conversion characteristics of this wired cell (iii) were evaluated using pseudo sunlight having an AM of 1.5, it was found that the conversion efficiency thereof was 3.1%.

COMPARATIVE EXAMPLE B1

A silver paste (having silver particles 92:glass frit 8 by percent by mass) was printed on a 100 mm square FTO glass substrate so as to obtain a circuit width of 250 μm and a film thickness of 8 μm, and this was dried and baked in the same conditions as in Example B1. A 300 nm FTO layer was formed on the surface thereof in the same procedures as in Example B1 to form the shielding layer 25, and thereby obtaining an electrode substrate (iv).

Using this electrode substrate (iv), a wired cell (iv) was obtained in the same procedures as in Example B1. When the electrolyte solution injected into this wired cell (iv) was observed, while the color was blackish brown immediately after the injection, it changed after several minutes to being substantially transparent. The reason for this was thought to be that the $I_3^-$ in the electrolyte were not being shielded and were reacting with the exposed silver and were reduced to $I^-$.

When the photoelectric conversion characteristics of this wired cell (iv) were evaluated using pseudo sunlight having an AM of 1.5, the conversion efficiency thereof was 0.29%.

COMPARATIVE EXAMPLE B2

A silver paste (having silver particles 55:glass frit 45 by percent by mass) was printed on a 100 mm square FTO glass substrate so as to obtain a circuit width of 250 μm and a film thickness of 8 μm, and this was dried and baked in the same conditions as in Example B1. A 300 nm FTO layer was formed on the surface thereof in the same procedures as in Example B1 to form the shielding layer 25, and thereby obtaining an electrode substrate (v).

Using this electrode substrate (v), a wired cell (v) was obtained in the same procedures as in Example B1. When the photoelectric conversion characteristics of this wired cell (v) were evaluated using pseudo sunlight having an AM of 1.5, the conversion efficiency thereof was 0.18%.

COMPARATIVE EXAMPLE B3

A gold circuit was formed using an additive plating method on a 100 mm square FTO glass substrate. The gold circuit was formed in a lattice pattern on the surface of the substrate, and the circuit width was 50 μm with the film thickness being 5 μm. A 300 nm FTO layer was formed on the surface thereof in the same procedures as in Example B1 to form the shielding layer 25, and thereby obtaining an electrode substrate (vi). When a cross section of this electrode substrate (vi) was observed using an SEM and analyzed with an EDX, undercut were observed that was considered to have been caused by the plating resist remaining like a trail at the bottom portion of the circuit (i.e., the wiring) which resulted in the FTO not being coated in shadow portions.

Using this electrode substrate (vi), a wired cell (vi) was obtained in the same procedures as in Example B1. When the photoelectric conversion characteristics of this wired cell (vi) were evaluated using pseudo sunlight having an AM of 1.5, the conversion efficiency thereof was 0.3%.

COMPARATIVE EXAMPLE B4

Using a 100 mm square FTO glass substrate, a test cell (vii) on which wire was not formed was obtained using the same procedures as in Example B1. When the photoelectric conversion characteristics of this wired cell (vii) were evaluated using pseudo sunlight having an AM of 1.5, the conversion efficiency thereof was 0.11%.

While the wired cells of Examples B1 to B3 all had excellent photoelectric conversion efficiency, in the wired cell (iv) of Comparative Example B1, the metal circuit layer 24 had only one layer and the shielding by the shielding layer 25 was insufficient. As a result, the characteristics of an electrode substrate could not be exploited, and the conversion efficiency was poor. In the wired cell (v) of Comparative Example B2, the metal circuit layer 24 had only one layer and the volume resistivity thereof was high. Therefore, because the resistance of the electrode substrate could not be lowered and a high output could not be obtained, the conversion efficiency was poor. In the wired cell (vi) of Comparative Example B3, the metal circuit layer 24 had only one layer and the shielding by the shielding layer 25 was insufficient. As a result, the characteristics of an electrode substrate could not be exploited, and the conversion efficiency was poor.

The electrode substrate 21 has a metal circuit layer 24 whose surface roughness is small and provides a substrate surface on which a dense shielding layer 25 without pinholes and the like can be formed. By using a dye-sensitized solar cell having this electrode substrate 21, corrosion of the metal wiring by the electrolyte solution and reverse electron transfer from the metal circuit layer 24 to the electrolyte solution is inhibited, and the output of the photoelectric conversion element is improved even further.

Figure 10:
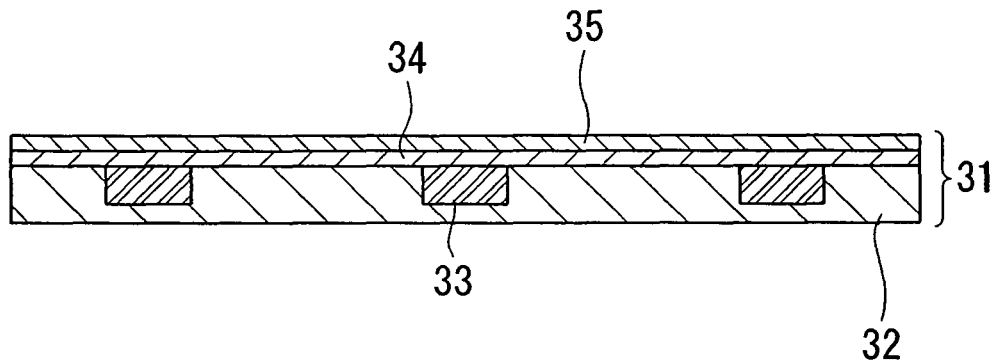

FIG. 10 is a schematic cross-sectional view showing another embodiment of the present invention.

A transparent substrate 32 has a wiring pattern in which grooves have been provided by a laser or by etching or the like. The convex portions formed by this groove formation are portions that extend to below the surface of the transparent substrate 32. The configuration thereof is not particularly limited and they may be in a lens shape, a U-shape or a V-shape. The portion referred to as the surface is the surface on the base material surface where a semiconductor porous film is formed and that is placed so as to face a counter electrode.

Glass such as heat-resistant glass is generally used for the transparent substrate 32, however, in addition to glass, for example, transparent plastics such as polyethylene terephthalate (PET), polyethylene naphthalate (PEN), polycarbonate (PC); polyether sulfone (PES) and the like, and polished ceramic plates of titanium oxide, alumina and the like, may be used. Materials having a high degree of light transmittance are preferable.

Figure 11:
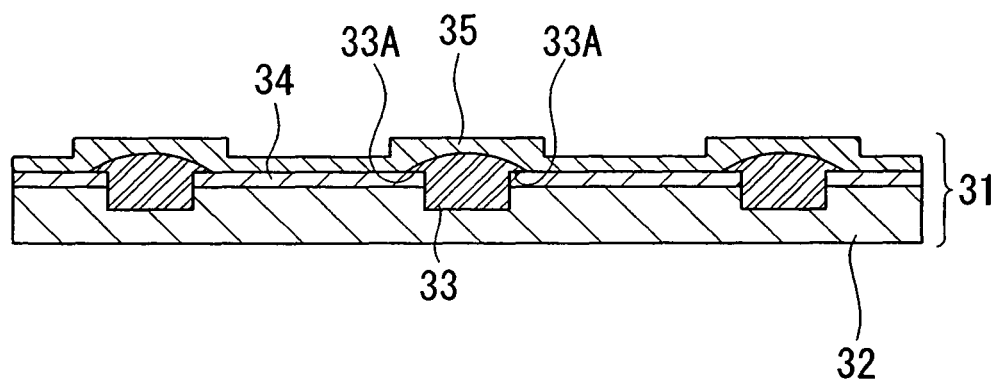

The metal circuit layer 33 is formed according to the wiring pattern that has been provided with grooves in the transparent substrate 32 and, provided that at least a portion of the metal circuit layer 33 is structured so as to be below the surface of the transparent substrate 32, there is no particular limitation thereon. For example, as shown in FIG. 10, a structure may be employed in which the surface of the metal circuit layer 33 is at the same level as the surface of the transparent substrate 32. Alternatively, as shown in FIG. 11, a structure may be employed in which the surface of the surface of the metal circuit layer 33 is higher than the surface of the transparent substrate 32, or, a structure may be employed (not shown) in which the entire metal circuit layer 33 is formed below the surface of the transparent substrate 33. In each of these embodiments, it is preferable that, when considering from the direction in which the shielding layer 35 is formed, a smooth shape is presented without large bumps and irregularities and no voids or undercut that may cast shadows. Moreover, the smaller the difference in height between the surface of the metal circuit layer 33 and the surface of the transparent substrate 32, the more preferable.

The material used to form the metal circuit layer 33 is not particularly limited and, for example, gold, silver, platinum, aluminum, nickel, titanium and the like may be used.

The method used to form the metal circuit layer 33 is not particularly limited and a variety of methods may be used, for example, printing methods such as screen printing, metal masking, and inkjet printing, as well as a plating method, a sputtering method, an evaporation method and the like may be used. It is particularly preferable to select a technique that includes at least one of a plating method and a printing method. The height of the surface of the metal circuit layer 33 can be adjusted by polishing so as to match the height of the surface of the transparent substrate 32.

The positional relationship between the metal circuit layer 33 and the transparent conductive layer 34 is not particularly limited. In the embodiment shown in FIG. 10, the metal circuit layer 33 is filled in the grooves formed in the surface of the substrate 32, and the transparent conductive layer 34 is then formed over the entire surface of the substrate 32. In this case, the entire top surface of the metal circuit layer 33 is in an electrical continuity with the bottom surface of the transparent conductive layer 34.

In the embodiment shown in FIG. 11, the transparent conductive layer 34 is formed over the entire surface of the substrate 32. Grooves are then formed according to the wiring pattern and the metal circuit layer 33 is filled inside these grooves. In this case, in order to define a good electrical continuity between the transparent conductive layer 34 and the metal circuit layer 33, it is preferable that top ends of the metal circuit layer 33 are raised above the transparent conductive layer 34, and cover the periphery of adjacent transparent conductive layers 34 in a uniform width. It is possible to ensure a reliable electrical continuity using these overhang portions 33A. The shielding layer 35 is then formed over the entire surface of the substrate 32. As shown in FIG. 11, the shielding layer 35 may be formed higher in positions above the metal circuit layer 33, or may be totally flat across its entire surface.

Figure 12A:
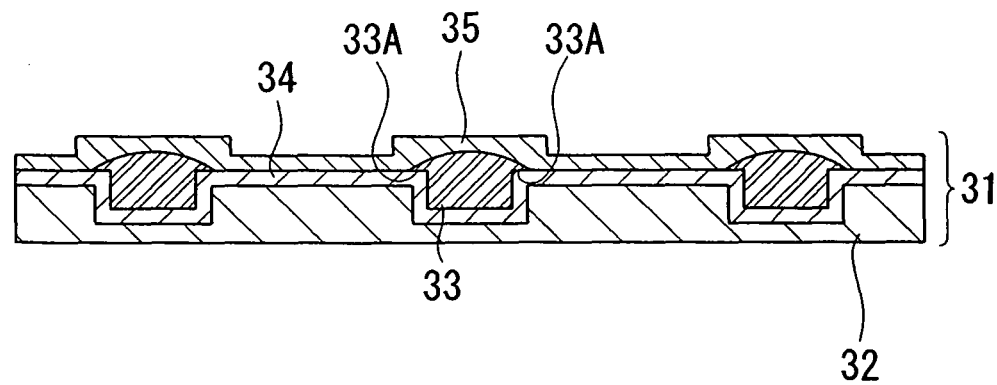
FIGS. 12A to 12C are cross-sectional views showing yet further embodiments of the electrode substrate of the present invention.

In the embodiment shown in FIG. 12A, groves are formed in the surface of the substrate 32 to form a wiring pattern, and the transparent conductive layer 34 is then formed over the entire surface of the substrate 32 including inside the grooves. The metal circuit layer 33 is then formed inside these grooves. In this case, in order to define a good electrical continuity between the transparent conductive layer 34 and the metal circuit layer 33, it is preferable that top ends of the metal circuit layer 33 are raised above the transparent conductive layer 34, and cover the periphery of adjacent transparent conductive layers 34 in a uniform width. It is possible to ensure a reliable electrical continuity using these overhang portions 33A. The shielding layer 35 is then formed over the entire surface of the metal circuit layer 33 and the substrate 32. As shown in FIG. 12, the shielding layer 35 may be formed higher in positions above the metal circuit layer 33, or may be totally flat across its entire surface.

Figure 12B:
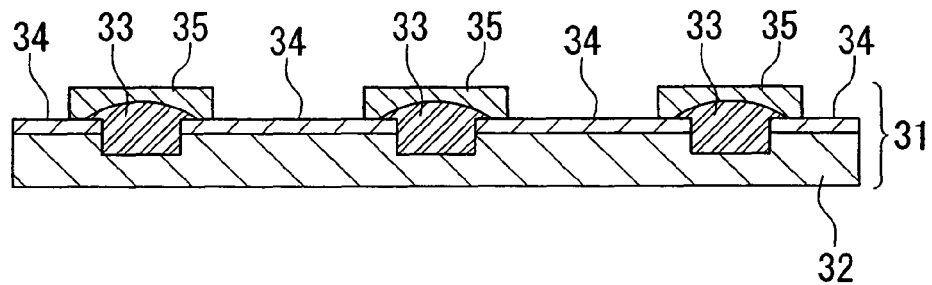
Figure 12C:
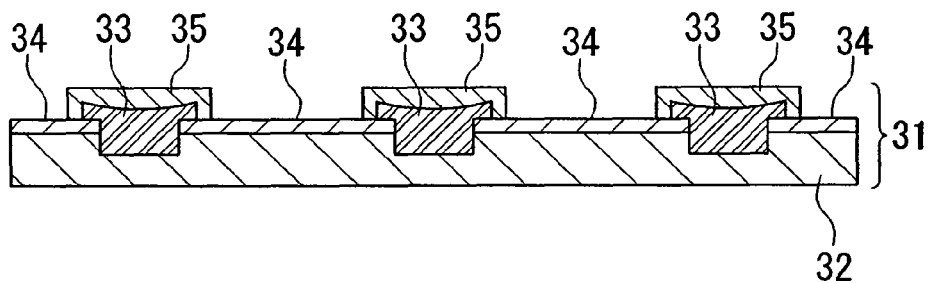

The embodiment shown in FIG. 12B is a variant of the embodiment shown in FIG. 11, and the shielding layer 35 is only formed only covering the metal circuit layer 33. As shown in FIG. 12C, top end surfaces of the metal circuit layer 33 may also be formed as concave surfaces due to volume reduction during the formation of the metal circuit layer 33.

Figure 12D:
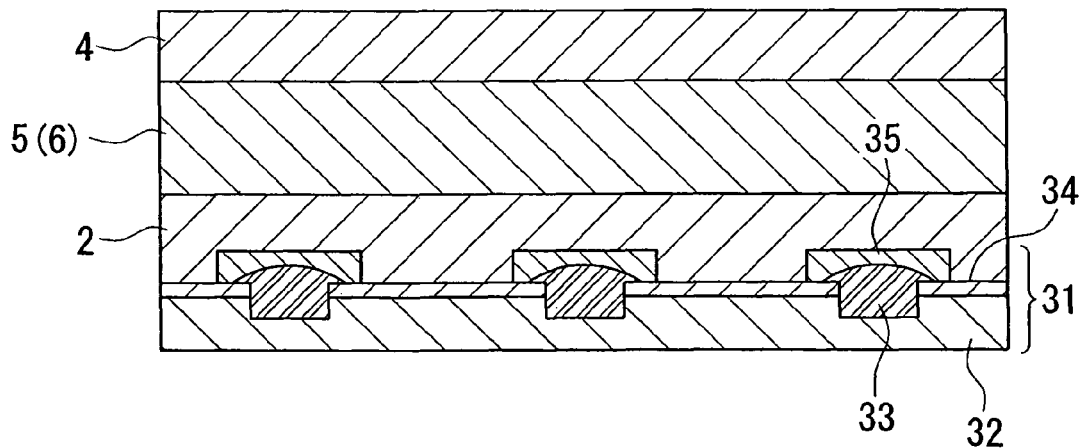
FIG. 12D is a cross-sectional view showing another embodiment of a photoelectric conversion element.

FIG. 12D is a cross-sectional view of an example of a dye-sensitized solar cell that uses the electrode substrate 31 shown in FIG. 12B. The same reference numerals are given to structure that is the same as structure in FIG. 1A, and a description thereof is omitted.

The material used to form the transparent conductive layer 34 is not particularly limited, and examples thereof include tin-doped indium oxide (ITO), tin oxide ($SnO_2$), fluorine-doped tin oxide (FTO) and the like. Preferably, a suitable material having as high a degree of light transmittance as possible is selected in accordance with the combination of materials and their application.

As the method for forming the transparent conductive layer 34, a suitable method may be used from among known methods such as, for example, a sputtering method, an evaporation method, and CVD or SPD according to the material used to form the transparent conductive layer 34.

In the electrode substrate 31 of this embodiment, when the transparent conductive layer 34 is formed on the substrate where the metal circuit layer 33 is provided, the transparent conductive layer 34 can also function as a shielding layer.

The shielding layer 35 is formed on a surface of the conductive layer having the metal circuit layer 33 and/or the transparent conductive layer 34. Preferably, at least one selected from the group consisting of a glass component, a metal oxide component, and an electrochemically inert resin component is contained in the shielding layer 35. Examples of the glass component include low melting point amorphous or crystalline glass components such as lead oxide based glass or lead borate based glass. Examples of the metal oxide component include titanium oxide, zinc oxide, fluorine-doped tin oxide (FTO), and tin-doped indium oxide (ITO). Examples of the electrochemically inert resin component include polyolefin based resins, polyimide based resins, polybenzoxazole based resins, and polyurethane based resins. These may be used alone or in a combination of two or more.

When the range to form the shielding layer 35 is larger than a region that includes the surface of the metal circuit layer 33 and the transparent portions in which the transparent conductive layer 34 is placed, it is necessary to select a material and thickness of the shielding layer 35 so that it does not largely impair the light transmittance and transfer of electrons from the semiconductor porous film (namely, that do not markedly reduce the cell characteristics). In the case of a shielding layer 35 that is made of a metal oxide component (i.e., an oxide semiconductor), more specifically, it is necessary to use a material whose electron transfer reaction rate with an electrolyte solution that contains a redox species with which it is in contact when it is used as a dye-sensitized solar cell is slow, and that it has a high light transmittance and does not inhibit the transfer of generated photoelectrons. Provided that the material has these required characteristics, it is not particularly limited, and examples thereof include titanium oxide, zinc oxide, niobium oxide, tin oxide, FTO, ITO, and the like.

The range to form the shielding layer 35 is not particularly limited provided that at least the surface of the metal circuit layer 33 is included. The range may include only the surface of the metal circuit layer 33, or may be a range that is larger than a region that includes the surface of the metal circuit layer 33 and the transparent portions in which the transparent conductive layer 34 is placed. Although less significant than the case of the metal circuit layer 33, it has been indicated that reverse electron transfer from the transparent conductive layer 34 is occurring. Therefore, by forming the shielding layer 35 in a range that is larger than a range that includes the transparent portions in which the transparent conductive layer 34 is placed, a more complete shielding is made possible.

The method used to form the shielding layer 35 is not particularly limited, and examples thereof include forming a film of a desired compound or a precursor thereof by performing a dry method (i.e., a vapor phase method) such as a sputtering method, an evaporation method or a CVD method. When a film is being formed using a precursor of a metal or the like, the shielding layer 35 can be formed by oxidizing the precursor using thermal treatment or chemical treatment.

If a wet method is used, after a solution obtained by dissolving or dispersing the desired compound or a precursor thereof has been coated using a method such as a spin coating method, a dipping method, or a blade coating method, the solution is chemically changed into the desired compound by thermal treatment or chemical treatment. Thus, the shielding layer 35 can be formed. Examples of the precursor include salts and complexes having constituent metallic elements of the desired compound. In order to obtain a more dense film (i.e., shielding layer 35), a dissolved solution is more preferable than a dispersion solution.

In the case of a spray decomposition method (SPD) or the like, the transparent substrate 32 having the transparent conductive layer 34 is heated, and a substance used as the precursor of the shielding layer 35 is sprayed thereon so as to thermally decompose it and change it into the objective oxide semiconductor. Thus, the shielding layer 35 is formed.

According to this embodiment, it is possible to restrict insufficient shielding in portions in which shadows may be cast during film formation such as undercut of the bottom portion or an inversed taper structure in the metal circuit layer 33, and any deterioration in the cell characteristics caused by this can be prevented. In the concave/convex structure of the surface of the electrode substrate 31, because the thickness of the circuit is increased without increasing the difference in height, it is possible to increase the opening area ratio of the electrode substrate 31 (i.e., the ratio of the non-wiring portion) and to achieve a lowering of the resistance.

Next, a description will be given of a dye-sensitized solar cell that uses the above-described electrode substrate 31.

The dye-sensitized solar cell of the present embodiment is provided with a working electrode that is formed on top of the above-described electrode substrate 31 and that is provided with a dye-sensitized oxide semiconductor porous film, and a counter electrode that is placed so as to face this working electrode. An electrolyte layer that contains a redox pair is provided between the working electrode and counter electrode.

The material used to form the semiconductor porous film may be the same as in the above-described embodiments. A variety of coating methods may be used to form the semiconductor porous film such as, for example, coating a colloid solution or dispersion solution (containing additives where necessary) using a screen printing method, an inkjet printing method, a roll coating method, a doctor blade method, a spin coating method, and a spray coating method. In addition, migration electrode deposition of minute particles, a method in which a foaming agent is added, or a method in which polymer beads are used (subsequently only the molding component is removed) may be used.

The dye that is provided in the semiconductor porous film and the electrolyte solution that is used for the electrolyte layer may be the same as those in the above embodiments. It is also possible to use what is known as a "gel electrolyte" which is quasi-solidified and is obtained by adding a suitable gelling agent into the electrolyte solution. The redox pair may also be the same as those of the above embodiments.

Instead of an electrolyte layer including an electrolyte solution, it is also possible to use a charge transfer layer that is made of a p-type semiconductor or the like. There are no particular limitations on the p-type semiconductor, and it is preferable to use, for example, monovalent copper compounds such as copper iodide, copper thiocyanide and the like. It is also possible for this charge transfer layer to contain a variety of additives where these are necessary for functionality or film formation. The method for forming the charge transfer layer is not particularly limited, and examples thereof include film forming methods such as a casting method, a sputtering method, and an evaporation method.

The counter electrode may be formed, for example, by a method such as vapor deposition or sputtering of a carbon based material, platinum, or gold on a conductive or insulating substrate.

Furthermore, if a solid charge transfer layer is used, it is possible to employ a technique in which a layer is formed directly on the surface thereof by sputtering or coating or the like.

Because the dye-sensitized solar cell of the present embodiment has the above-described electrode substrate 31, corrosion of the metal wiring by the electrolyte solution and reverse electron transfer from the metal circuit layer 33 to the electrolyte solution is inhibited, and the output of the photoelectric conversion element is improved even further.

Next, examples of the above-described embodiment will be given.

EXAMPLE C1

Grooves having a depth of 5 µm were formed in a lattice circuit pattern in the surface of a 100 mm×100 mm glass substrate provided with an FTO film. In order to enable this substrate to be plated, a metal conductive layer (i.e., a seed layer) was formed thereon using a sputtering method, and the metal circuit layer 33 was further formed thereon by additive plating. The metal circuit layer 33 was formed in a convex lens shape extending to a height of 3 µm from the surface of the transparent substrate 32. The circuit width was 60 µm. An FTO film having a thickness of 400 nm was then formed on top of this as the shielding layer 35 using an SPD method.

Thus, an electrode substrate (i) was obtained. The cross-sectional profile of the electrode substrate (i) is similar to that shown in FIG. 11.

A titanium oxide dispersion solution containing titanium oxide of an average particle size of 25 nm was coated on the electrode substrate (i) and dried, and then heated and baked at 450° C. for one hour. This was then immersed overnight in an ethanol solution of a ruthenium bipyridine complex (an N3 dye) so as to be sensitized with a dye. The substrate was positioned facing a platinum sputtered FTO substrate with a 50 μm thick thermoplastic polyolefin resin sheet interposed between the substrate plates. The two electrode plates were then secured by heat-melting the resin sheet. An electrolyte solution injection aperture was defined beforehand in the platinum sputtered electrode. A methoxy acetonitrile solution that contained 0.5 M of an iodide salt and 0.05M of iodine as main components was then injected between the two electrodes. In addition, peripheral portions and the electrolyte solution injection aperture were fully sealed using an epoxy based sealing resin, and a silver paste was coated on a current collecting terminal portion so as to prepare a test cell (i). When the photoelectric conversion characteristics of this test cell (i) were evaluated using pseudo sunlight having an AM of 1.5, the conversion efficiency thereof was 2.8%.

EXAMPLE C2

A circuit pattern was engraved a using a laser engraver in the surface of a place of 100 mm×100 mm heat-resistant glass so as to form a metal circuit layer 33 the same as that in Example C1. Using an SPD method, an FTO film having a thickness of 1000 nm was then formed on top of this, which functions as both the transparent conductive layer 34 and the shielding layer 35. Thus, an electrode substrate (ii) was obtained. The cross-sectional profile of the electrode substrate (ii) was the same as that shown in FIG. 11 except for the fact that the transparent conductive layer 34 extends to above the metal circuit layer.

Using this electrode substrate (ii), a test cell (ii) was manufactured in the same procedures as in Example C1. When the photoelectric conversion characteristics of this wired cell (ii) were evaluated using pseudo sunlight having an AM of 1.5, the conversion efficiency thereof was 3.0%.

EXAMPLE C3

After the same metal circuit layer 33 as that in Example C1 had been formed on the surface of a heat-resistant glass substrate, the metal circuit layer 33 was polished so that the surface was substantially the same level as the surface of the substrate using a wafer polisher. Using an SPD method, an FTO film having a thickness of 1000 nm was then formed on top of this, which functions as both the transparent conductive layer 34 and the shielding layer 35. In addition, a titanium oxide film having a thickness of 30 nm was formed on top thereof as the shielding layer 35 using the sputtering method. Thus, an electrode substrate (iii) was obtained. The cross-sectional profile of the electrode substrate (ii) was the same as that shown in FIG. 10.

Using this electrode substrate (iii), a test cell (iii) was obtained in the same procedures as in Example C1. When the photoelectric conversion characteristics of this test cell (iii) were evaluated using pseudo sunlight having an AM of 1.5, the conversion efficiency thereof was 3.1%.

COMPARATIVE EXAMPLE C1

A metal circuit layer 33 (i.e., a gold circuit) was formed using an additive plating method on a 100 mm square FTO glass substrate. The metal circuit layer 33 (i.e., the gold circuit) was formed in a lattice pattern on the surface of the substrate. The circuit width was 50 μm, and the circuit thickness was 5 μm. An FTO film having a thickness of 300 nm was then formed on this surface as the shielding layer 35 using an SPD method. As a result, an electrode substrate (iv) was obtained. When a cross section of this electrode substrate (iv) was observed using an SEM and analyzed with an EDX, undercut were observed that was considered to have been caused by the plating resist remaining like a trail at the bottom portion of the wiring which resulted in the FTO not being coated in shadow portions.

Using this electrode substrate (iv), a test cell (iv) was obtained in the same procedures as in Example C1. When the photoelectric conversion characteristics of this test cell (iv) were evaluated using pseudo sunlight having an AM of 1.5, the conversion efficiency thereof was 0.3%.

COMPARATIVE EXAMPLE C2

For purposes of comparison an unwired test cell (v) was manufactured by the same process as in Example C1 using a 100 mm square FTO glass substrate. When the photoelectric conversion characteristics of this test cell (v) were evaluated using pseudo sunlight having an AM of 1.5, the conversion efficiency thereof was 0.11%.

From these results it was turned out that while the test cells (i) to (iii) obtained in Examples C1 to C3 all had excellent photoelectric conversion efficiency, in the test cell (iv) obtained in Comparative Example C1, the shielding by the shielding layer 35 was insufficient. As a result, the characteristics of an electrode substrate could not be exploited, and the conversion efficiency was poor.

By comparing this with Comparative Example C2, it was determined that according to a test cell that uses the electrode substrate of the embodiments of the present invention, the photoelectric conversion efficiency was greatly increased in a cell having a large surface area such as 100 mm square.

Another embodiment of the present invention is a conductive glass substrate for use as a photoelectric conversion element in which, in a conductive glass substrate that has, on a glass substrate on which a transparent conductive film has been coated, a conductive circuit layer made of a metal having a catalytic action with a metal that easily form a passive state or a metal to be substituted with the metal that easily form a passive state or a material containing such a metal, and that has an insulating circuit protection layer that is formed on top of the conductive circuit layer, the metal that easily form a passive state is provided in pinhole portions that are generated in the circuit protection layer. In this case, a conductive glass substrate for use in a photoelectric conversion element is obtained that has a high degree of light transmittance, is resistant to chemicals, and has low leak current and excellent conductivity.

Figure 13:
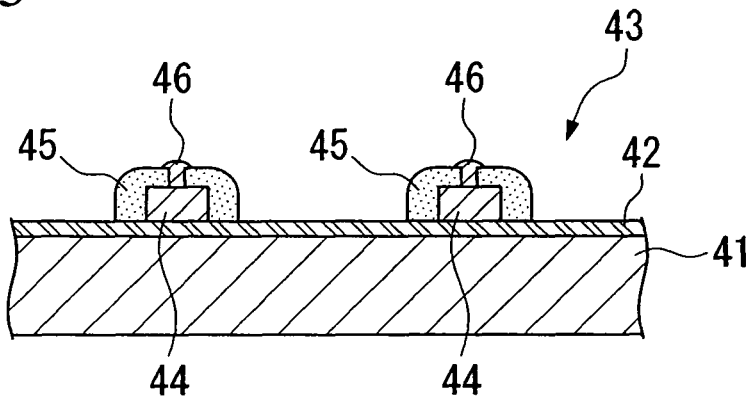
FIG. 13 is a cross-sectional view of an embodiment of the conductive glass substrate of the present invention.

Referring to FIG. 13, reference numeral 41 denotes a glass plate made of soda glass or heat-resistant glass typically having a thickness of about 1 to 5 mm. Reference numeral 42 denotes a transparent conductive film that is provided on top of the glass plate 41 and is made of indium-doped tin oxide (ITO) or fluorine-doped tin oxide (FTO) typically having a thickness of about 0.2 to 1 μm. A conductive circuit 44 is formed on top of the transparent conductive film 42. The conductive circuit 44 is formed using a metal having a catalyst action with a metal that easily form a passive state that is provided subsequently, or a metal that is to be substituted with metal that easily form a passive state, or a material containing such a metal. The conductive circuit 44 is formed having a line width of about 10 to 1000 μm by plating, screen printing or the like. Typically, the two-dimensional configuration thereof is a lattice pattern or a comb pattern. The present invention is not limited to these. The opening area ratio of the conductive circuit 44 is preferably 75% or more, and may be 90 to 99%. If the opening area ratio is less than 75%, the light transmittance is reduced and the amount of incoming light is insufficient. If the opening area ratio exceeds 99%, the conductivity may be insufficient. For example, the opening area ratio may be 75 to 85%, however, it is not limited to this range. The opening area ratio is defined as the percentage of the total surface area of the circuit in a unit surface area.

The conductive circuit layer can be formed using a metal such as gold, silver, platinum, palladium, copper, or aluminum, or a conductive paste that includes at least one of these metals. The conductive paste contains as glass frit the adhesive component is provided fine conductive particles, with the fine conductive particles made from a metal also acting as a catalyst for a metal that easily form a passive state that is to be provided later, a metal to be substituted with the metal that easily form a passive state, may be used. Preferably, the conductive paste includes at least one of gold, silver, platinum, palladium, copper, or aluminum. Among them, a conductive paste to which silver particles have been added is preferable.

An insulating circuit protective layer 45 is formed on the conductive circuit 44. This insulating protective layer 45 is formed in order to prevent leak current in which electrons flow in reverse from the conductive circuit 44 into the electrolyte solution, and is formed so as to provide a sufficient insulating coating for the circuit 41. Generally, for the purpose of adhesion to the circuit 41, a paste material having glass frit as the adhesive component is used, however, if the conductive circuit 44 is made of a conductive paste, this insulating paste material is preferably able to be baked at a lower temperature than that of the conductive paste. Specifically, lead borosilica glass frit, inorganic adhesives, organic adhesives and the like are used. The insulating paste is typically formed by completely coating the top of the circuit 41 by screen printing. Preferably, this coating formation process is repeated several times. It is preferable that the insulating circuit protective layer 45 is able to exhibit its function satisfactorily at this stage, however, because this protective layer is a thin layer and is a baked layer in which glass frit has been used, pinholes tend to be generated in this circuit protective layer 45, in which case the problem of leak current arises.

In order to solve the problem of pinholes, metal that easily form a passive state is formed for the insulating circuit protective layer 45. Specifically, it is formed by electroless metal plating process. Passive metals such as nickel, copper, and aluminum that are known to be able to be used as low resistance circuits are used, however, in order to lower manufacturing costs and the like, a material that can form a metal passive state by electroless metal plating is preferably selected. In other words, the electroless metal plating process may be electroless nickel plating processing, electroless cobalt plating processing, or electroless tin plating processing. By performing this type of electroless nickel plating processing, electroless cobalt plating processing, or electroless tin plating processing, a metal that easily form a passive state is provided in pinhole portions by the metal that easily form a passive state such as nickel, cobalt or tin being precipitated, resulting in any conduction between the conductive substrate 44 and the electrolyte solution being blocked. In other words, metal that easily form a passive state that indicated by reference numeral 46 in FIG. 13 is formed. This phenomenon is due to the action arising when one selected from among metals such as palladium, platinum, gold, silver, copper, and aluminum, which are the metals used to form the above-described circuit 41, is added as a catalytic metal or substituent metal. In other words, in the catalytic type or the substituent type of electroless metal plating process, the metal plating is precipitated on top of a metal having a catalyst action. Because both the catalytic type and substituent type of metals are conductive elements, they may be used by being added to the conductive paste used in circuit formation. By employing electroless nickel plating processing, electroless cobalt plating processing, or electroless tin plating processing as the electroless metal plating process for forming the metal that easily form a passive state in this manner, it is possible to obtain a conductive glass substrate 43 for use in a photoelectric conversion element in which pinholes in the circuit protective layer are completely prevented. This type of conductive glass substrate for use in a photoelectric conversion element has a high degree of light transmittance, has excellent leak current characteristics and conductivity, and is resistant to chemicals.

Next, a description will be given of a dye-sensitized solar cell that uses the above-described conductive glass substrate. A conductive glass substrate for use in a photoelectric conversion element is a glass plate that has been provided with a transparent conductive film, a conductive circuit layer that is formed on the glass plate using a material that has a catalytic action with a metal that easily form a passive state or is to be substituted with the metal that easily form a passive state, an insulating circuit protection layer, and a metal that easily form a passive state that is formed in pinholes in the circuit protective layer. On conductive glass substrate, an oxide semiconductor porous film having a thickness of about 5 to 50 μm on a conductive glass substrate for use in a photoelectric conversion element. In oxide semiconductor porous film, minute metal oxide particles are sensitized with what are known as photo-sensitizing dyes. The photo-sensitizing dyes include ruthenium complexes containing ligands of bipyridine structures, terpyridine structures, and the like; metal complexes such as porphyrin and phthalocyanine; and organic dyes such as eosin, rhodamine, and melocyanine. The minute metal oxide particles may be particles of titanium oxide, tin oxide, tungsten oxide, zinc oxide, zirconium oxide, niobium oxide, and the like. An electrode circuit is then further provided above this as a counter electrode, and the space between the counter electrode and the oxide semiconductor porous film is filled with an electrolyte solution. A non-aqueous electrolyte solution that contains a redox pair is typically used for this electrolyte solution. Instead of the electrolyte solution, it is also possible to use a hole transporting layer made of a p-type semiconductor. If this type of hole transporting layer is used, there is no solution leakage problem as the case with electrolyte solution. In a dye-sensitized solar cell having the above-described structure, because pinholes in the circuit protective layer are completely eliminated with the electroless metal plating process, there is no problem caused by leak current, nor is the conductive circuit corroded by electrolyte solution. Moreover, this type of solar cell can be manufactured at comparatively low cost, and can, therefore, be practically used.

The manufacturing method of the present embodiment will now be described. A transparent conductive film layer is formed on the surface of a glass plate. Next, a conductive circuit layer is formed thereon using a metal having a catalytic action, or a metal to be substituted, or a material containing above-described metal by a plating method or a screen printing method. A circuit protective layer is then formed thinly thereon using, for example, an insulating paste by a printing method such as screen printing, spin printing, or a doctor blade method. Next, metal that easily form a passive state is formed in pinholes in the circuit protective layer by the electroless plating processing of nickel, cobalt, or tin. According to this method, a conductive glass substrate for use in a photoelectric conversion element is obtained that has a high degree of light transmittance, has excellent leak current characteristics and conductivity, and is resistant to chemicals. In addition, this conductive glass substrate for use in a photoelectric conversion element can be manufactured at low cost. In other words, an desirable conductive circuit layer 41 is formed by a plating method or screen printing method using a metal such as gold, silver, platinum, palladium, copper, and aluminum or a conductive paste that contains at least one of these metals. A circuit protective layer is then formed thinly on top of this using an insulating paste by a plating method such as a screen printing method, a spin coating method, or a doctor blade method. Next, the conductive glass substrate for use in a photoelectric conversion element undergoes an electroless plating processing using, preferably, nickel, cobalt, or tin. Consequently, a high-performance conductive glass substrate for use in a photoelectric conversion element can be manufactured by a comparatively simple method. In the conductive glass substrate for use in a photoelectric conversion element that is thus obtained, because the metal that easily form a passive state is formed such that pinhole portions in the circuit protective layer are filled, pinholes can be eliminated, and the conductive circuit can be sufficiently shielded from the electrolyte solution.

EXAMPLE D1

The advantageous effects of the present embodiment will now be described using an Example D1. Three types of lattice-patterned conductive circuits having opening area ratios of 90%, 95%, and 99% were formed having line widths of 100 μm by screen printing using a baking type of silver printing paste on a glass plate (commercially available from Asahi Glass Co., Ltd.) on which a fluorine-doped tin oxide layer had been formed. Next, a low temperature baking type of paste containing lead borosilicate glass frit was screen printed at a line width of 200 μm on the above circuits. The circuits were then baked for one hour at 550° C. There procedures were repeated twice, to form an insulating circuit protective layer. Next, the glass substrates on which this circuit protective layer had been formed were immersed in an electroless nickel plating bath ("Top Nikoron TOM-S", manufactured by Okuno Chemical Industries, Co., Ltd.), an electroless cobalt plating bath (containing cobalt sulfate, glycine, ammonium citrate, and dimethylamine borane), and an electroless tin plating bath for five minutes at a temperature of 90° C. Thus, nickel, cobalt, and tin metals were formed respectively, and conductive glass substrates for use in a photoelectric conversion element were obtained. After these conductive glass substrates had been cleaned, they were immersed for 60 minutes in an iodine electrolyte solution. They were then dried, and the circuit protective layer was observed using an SEM (scanning electron microscope).

COMPARATIVE EXAMPLE D1

For Comparative Example D1, a circuit that had undergone processing as far as the step where the insulating circuit protective layer was formed was immersed in an iodine electrolyte solution in the same conditions as in Example D1, and was observed similarly.

The results were that absolutely no needle-shaped silver, cobalt, or tin metal was observed on the insulating circuit protective layer on the transparent glass substrates that had undergone the electroless nickel plating processing, the electroless cobalt plating processing, and the electroless tin plating processing (i.e., on Example D1). The leak current was also excellent with each circuit being 0.1 mA/cm$^2$ or less. In contrast, in the circuit of Comparative Example D1, a large number of portions in which needle-shaped silver had precipitated were found on the circuit protective layer. The leak current was also 0.5 mA/cm$^2$ or higher.

In this manner, by filling pinholes by forming a metal that easily form a passive state on a circuit on which a circuit protective layer has been formed, a conductive glass substrate for use in a photoelectric conversion element has substantially no leak current and has excellent conductivity. In addition, it has a high degree of light transmittance and excellent chemical resistance. Moreover, by employing electroless metal plating process for the manufacturing method, it is possible to provide an inexpensive conductive glass substrate for use in a photoelectric conversion element using a comparatively simple manufacturing method.

As described above, the conductive glass substrate of this embodiment has, on a glass plate that has been provided with a transparent conductive film, a conductive circuit layer that is made of a metal having a catalytic action with a metal that easily form a passive state, or a metal to be substituted with the metal that easily form a passive state, or a material containing such a metal and an insulating circuit protective layer that is formed on top of the conductive circuit layer. Because the metal that easily form a passive state is formed on pinhole portions that are present in the circuit protective layer, the problem of leak current can be significantly reduced. Moreover, the conductive glass substrate has excellent conductivity, a high degree of light transmittance, and excellent chemical resistance.

If the metal that easily form a passive state is formed by electroless metal plating process, pinholes generated in the insulating circuit protective layer are completely filled. Moreover, a conductive glass substrate having excellent conductivity, a high degree of light transmittance, and excellent chemical resistance can be manufactured comparatively simply and inexpensively.

In a dye-sensitized solar cell that uses a conductive glass substrate for use in a photoelectric conversion element, because pinholes generated in the insulating circuit protective layer are completely filled in the electroless metal plating process, a dye-sensitized solar cell in which there is substantially no problem of leak current can be manufactured at a comparatively low cost.

In the method for manufacturing the conductive glass substrate of this embodiment, a transparent conductive film layer is formed on the surface of a glass plate. Next, a conductive circuit layer is formed thereon using a metal having a catalytic action, or a metal to be substituted, or a material containing such a metal by plating or by screen printing. A circuit protective layer is then formed thereon using an insulating paste. Next, metal that easily form a passive state is formed thereon by the electroless plating processing of nickel, cobalt, or tin. According to this method, a conductive glass substrate for use in a photoelectric conversion element is obtained that has no leak current problem and excellent conductivity, and is resistant to chemicals can be manufactured at comparatively low cost.

When manufacturing the conductive circuit, by employing a method for manufacturing a conductive glass substrate for use in a photoelectric conversion element that uses a metal such as gold, silver, platinum, palladium, copper, or aluminum or uses a conductive paste that contains at least one of these metals as a metal that acts as a catalyst with a metal that easily form a passive state or a metal that is to be substituted with the metal that easily form a passive state, and by further employing a method for manufacturing a conductive glass substrate for use in a photoelectric conversion element in which electroless nickel plating processing, electroless cobalt plating processing, or electroless tin plating processing is used for the electroless metal plating process, pinholes generated in the insulating circuit protective layer are completely filled in the electroless metal plating process. As a result, a conductive glass substrate for use in a photoelectric conversion element that has substantially no leak current problem and excellent conductivity and a high degree of light transmittance, and is resistant to chemicals can be manufactured at comparatively low cost, and can, therefore, be practically used.

Figure 14:
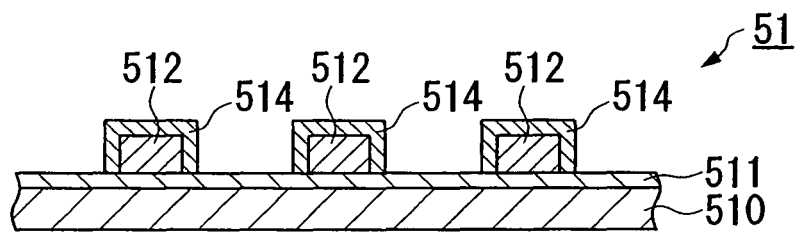
FIG. 14 is a cross-sectional view showing yet another embodiment of the electrode substrate of the present invention.

Another embodiment of the present invention will now be described. FIG. 14 is a cross-sectional view showing an embodiment of an electrode substrate 51 of the present invention.

As shown in FIG. 14, the electrode substrate 51 of the present embodiment is provided with a base material 510, a transparent conductive later 511 that is formed on the base material 510, a metal wiring later 512 that is formed on the transparent conductive later 511, and an insulating layer 514 that covers the surface of the metal circuit layer 512. In other words, the metal circuit layer 512 is insulated and covered by the insulating layer 514.

The material used for the base material 510 may be the same as that used for the base material 10.

The transparent conductive layer 511 is formed on the base material 510 extending over an area that is wider than the region in which the metal circuit layer 512 is formed. The material of the transparent conductive layer 511 is not particularly limited, and a material can be selected in accordance with the combination of materials and their application with consideration given to the light transmittance, conductivity, and the like. Specific examples of conductive metal oxides include tin-doped indium oxide (ITO), tin oxide ($SnO_2$), fluorine-doped tin oxide (FTO), and the like.

A known method that is suitable for the material of the transparent conductive layer 511 may be used as the method for forming the transparent conductive layer 511. Examples thereof include a sputtering method, an evaporation method, an SPD method, a CVD method or the like. In consideration of the light transmittance and the conductivity, the transparent conductive layer 511 is typically formed with a film thickness of about 0.001 μm to 10 μm.

Figure 15:
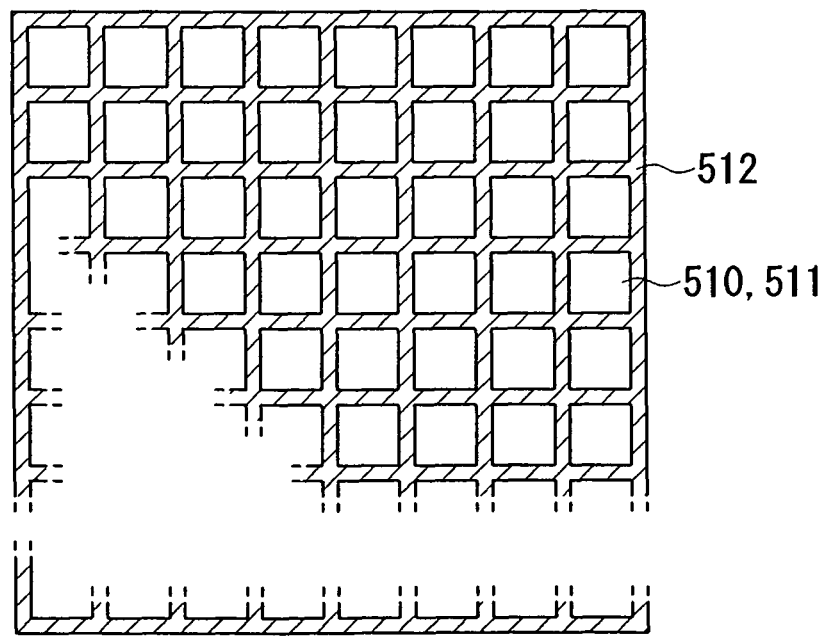
FIG. 15 is a plan view showing an example of the planar configuration of a metal circuit layer.

The metal circuit layer 512 is formed using a metal such as gold, silver, platinum, aluminum, nickel, titanium, or the like for the wiring. The wiring pattern of the metal circuit layer 512 is not particularly limited, and may be formed in a lattice pattern such as shown in FIG. 15, a stripe pattern, a thin strip pattern, or a comb pattern.

Although there are no particular limitations thereon, it is preferable that the width of the respective wires of the metal circuit layer 512 is narrow, i.e., 1000 μm or less, in order that the light transmittance of the electrode substrate 51 is not largely impaired. The thickness (i.e., the height) of each wire of the metal circuit layer 12 is not particularly limited, however, it is preferably between 0.1 μm and 10 μm.

Examples of the method used to form the metal circuit layer 512 include a method in which a paste is prepared by mixing metal particles that are to be conductive particles with a bonding agent such as fine glass particles, and coating this so as to form a predetermined pattern using a printing method such as a screen printing method, a metal mask method, or an inkjet method, and then heating the substrate so as to bake it and make the conductive particles fused. If the base material 510 is, for example, glass, the baking temperature is preferably 600° C. or lower, and more preferably 550° C. or lower. In addition, a formation method such as a sputtering method, an evaporation method, and a plating method may be used.

Preferably, the surface of the metal circuit layer 512 is smooth, however, it is more important that it has a high level of conductivity and it is acceptable if a small amount of protrusions or irregularities or the like are present.

The specific resistance of the metal circuit layer 512 is preferably at least $9 \times 10^{-5}$ Ω·cm or lower, and more preferably, $5 \times 10^{-5}$ Ω·cm.

The insulating layer 514 insulates and covers the metal circuit layer by forming a film by stacking either one layer or a plurality of layers of an insulating material containing a heat-resistant ceramic on the regions in which the metal circuit layer 512 has been formed.

As the heat-resistant ceramic, at least one from, for example, alumina, zirconia, and silica can be selected, and a plurality of these may be used in combination. Preferably, the heat resistance of the heat-resistant ceramic is such that it is able to withstand the thermal history during the manufacturing of the electrode substrate.

More specifically, it is preferable that the heat-resistant ceramic is made using an aggregate of heat-resistant ceramic and a binding agent containing at least one of silicate, colloidal silica, alkyl silicate, and metal alkoxide or a plurality of these.

This type of insulating layer 514 can be obtained from an adhesive composition (i.e., an overcoat material) that includes, as its main components, an aggregate and the aforementioned binding agent, and a hardening agent and the like. The adhesive composition provides an insulating cured film (i.e., a reactive inorganic coating layer) whose main component is a heat-resistant ceramic such as alumina, zirconia, or silica or an inorganic polymer such as polysiloxane, and polysilane by a reaction such as a hydrolysis reaction, a condensation reaction or a polymerization reaction. A commercially available material as a reactive inorganic adhesive agent may be used, for example.

A method for forming the overcoat material film is preferably a printing method form the view points of manufacturing process and costs. However, the method is not limited to a printing method, and a spray method, immersion method, or doctor blade method may also be used.

Preferably, the insulating layer 514 is a dense layer with no defects such as large pinholes. A single insulating layer 514 or a plurality of insulating layers 514 may be provided.

If the insulating layer 514 includes a plurality of layers, it is possible to use a combination of a plurality of types of the above-described insulating materials. Furthermore, it is also possible for one or more layers of a plurality of insulating layers to be made of a lead based low melting point glass such as, for example, PbO and PbO—$B_2O_3$, or a non-lead based low melting point glass. However, if there are a plurality of insulating layers, it is necessary for at least one of the insulating layers to have the above-described heat-resistant ceramic as its main component.

The above-described insulating layer 514 is excellent from the viewpoint of acid resistance and the like compared with when the insulating layer is formed using only low melting point glass.

According to the electrode substrate of the present embodiment, because the insulating layer 514 has heat-resistant ceramic as its main component, it has excellent heat resistance and acid resistance. As a result, there is no deterioration caused by the thermal history during manufacturing. Consequently, the metal circuit layer 512 is reliably shielded from the electrolyte solution, and the problems of corrosion of the metal circuit layer 512 as well as deterioration of the electrolyte due to a reaction with the metal included in the metal circuit layer 512, and the problem of leak current are effectively prevented.

In this manner, the insulating layer exhibits its capabilities in a stable manner, and its excellent characteristics can be maintained for a long time.

A variant of the electrode substrate of the present invention will now be described. In the electrode substrate of the variant that is described below, structure that has the same reference numerals as in FIG. 14 is the same as or similar to the structure of the electrode substrate of the first embodiment shown in FIG. 14. Accordingly, a repeated description thereof is omitted.

Figure 16:
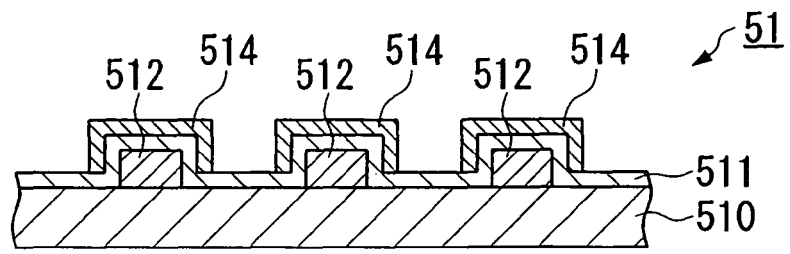
FIGS. 16 to 24 are cross-sectional views showing other embodiments of the electrode substrate of the present invention.

FIG. 16 is a schematic cross-sectional view showing another embodiment of an electrode substrate.

In the electrode substrate 51 of this embodiment, the metal circuit layer 512 is provided on top of the base material 510, the transparent conductive layer 511 is formed over the top of the metal circuit layer 512 while extending across an area that is wider than the region in which the metal circuit layer 512 is formed. The insulating layer 514 is formed on the transparent conductive layer 511 overlapping the pattern of the metal circuit layer 512 so as to cover top surfaces and side surfaces of the metal circuit layer 512. In other words, the insulating layer 514 is provided on the metal circuit layer 512 via the transparent conductive layer 511.

According to this type of electrode substrate 51, in the same manner as the electrode substrate 51 of the above-described first embodiment shown in FIG. 14, because the metal circuit layer 512 is insulated and shielded by the insulating layer 514, it is possible to suppress the generation of leak current and to manufacture an electrode substrate 51 having excellent conduction characteristics.

In the above-described electrode substrate, the metal circuit layer 512 is formed either directly on the base material 510 or via the transparent conductive layer 511 and the like to a height that is above the surface of the base material 510, however, the electrode substrate of the present invention is not limited to this.

As shown in FIGS. 16 to 19, it is possible to employ a structure in which at least a portion of the metal circuit layer 512 is located inside concave portions 510a that are formed in the base material 510.

A base material surface 510b is a surface on which the transparent conductive layer 511 and the metal circuit layer 512 are formed. When the electrode substrate 51 is used in a dye-sensitized solar cell, the oxide semiconductor porous film and the counter electrode and the like are to be provided on the base material surface 510b side.

The concave portions 510a are formed as concave shaped portions such as grooves or cavities according to the wiring pattern. The concave portions may be formed using a processing method that is appropriate to the material of the base material 510 and they may be formed, for example, by a laser or by etching. The cross-sectional profile of the concave portions 510a is not particularly limited and may be a lens shape, a semicircular shape, a U-shape, a V-shape, a corniform shape, or the like. The materials and formation method of the metal circuit layer 512 may be the same as the above-described materials and formation method.

Figure 17:
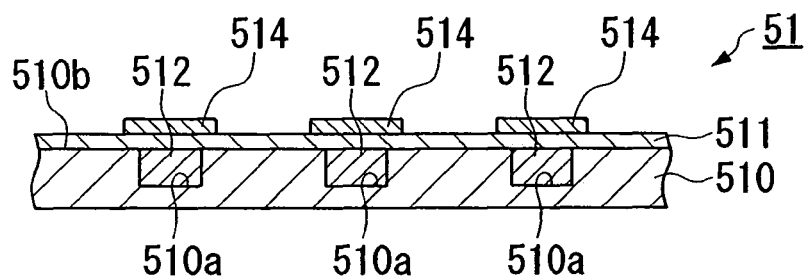
Figure 18:
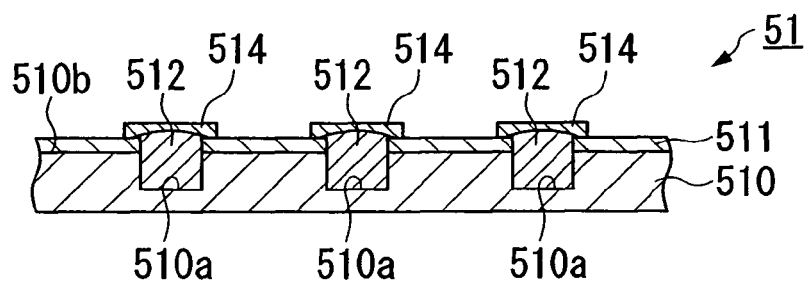
Figure 19:
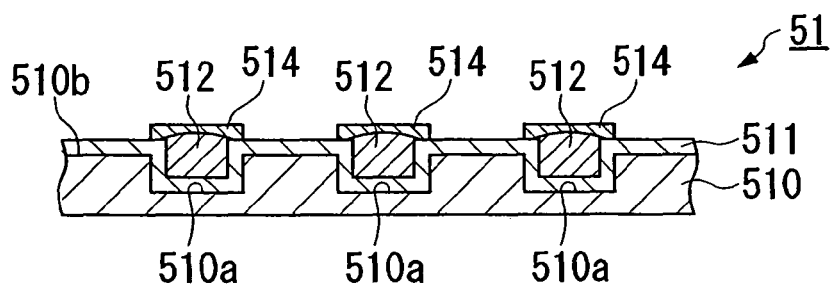
Figure 20:
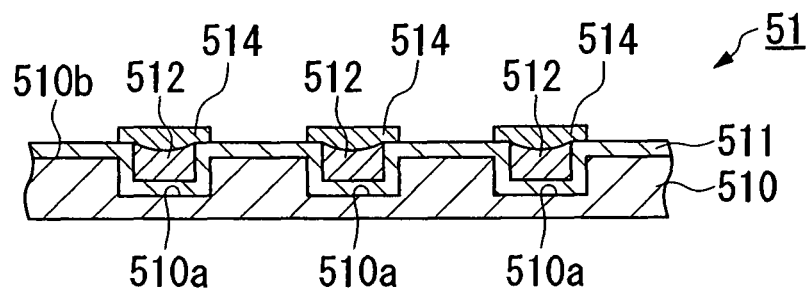

In this embodiment, the structure of the metal circuit layer 512 is not particularly limited provided that at least a portion of the metal circuit layer 512 is positioned inside the concave portions 510a in the base material surface 510b of the base material 510 (i.e., is below the base material surface 510). For example, as shown in FIG. 17, a structure may be employed in which the surface of the metal circuit layer 512 is the same level as the base material surface 510b or, as shown in FIGS. 18 and 19, a structure may be employed in which the surface of the metal circuit layer 512 is higher than the base material surface 510b. Alternatively, as shown in FIG. 20, a structure may be employed in which the entire metal circuit layer 512 is positioned below the base material surface 510b.

The positional relationship between the metal circuit layer 512 and the transparent conductive electrode is not particularly limited. Examples thereof include: a structure in which, as shown in FIG. 17, the transparent electrode layer 511 is formed above the metal circuit layer 512 and the base material surface 510b; a structure in which, as shown in FIG. 18, the transparent conductive layer 511 is formed on the base material surface 510b and is connected to the metal circuit layer 512; and a structure in which, as shown in FIGS. 19 and 20, the transparent conductive layer 511 is formed on the concave portions 510a and the base material surface 510b, and the metal circuit layer 512 is formed on the transparent conductive layer 511.

The metal circuit layer 512 may be in contact with the inner surface of the concave portions 510a, or another layer such as the transparent conductive layer 511 may be interposed between the inner surface of the concave portions 510a and the metal circuit layer 512.

The insulating layer 514 may be formed so as to be superimposed at least on a region in which the metal circuit layer 512 is formed. The insulating layer 514 may be formed either directly on the metal circuit layer 512, or another layer such as the transparent conductive layer 511 may be interposed between the insulating layer 514 and the metal circuit layer 512.

In all of the above configurations, it is preferable that the metal circuit layer 512 presents a smooth shape without large bumps and irregularities and a minimized number of voids or undercut that may cast shadows. Moreover, the smaller the difference in height between the surface of the metal circuit layer 512 and the base material surface 510b of the base material 510, the more desirable.

As described above, if at least a portion of the metal circuit layer 512 is below the base material surface 510b, it is possible to increase the thickness of the metal circuit layer 512 without increasing the difference in height between the surface of the metal circuit layer 512 and the base material surface 510b. Consequently, it is possible to increase the opening area ratio (i.e., the ratio of regions the metal circuit layer 512 is not formed) of the base material 510, and also reduce the electrical resistance of the circuit.

Figure 21:
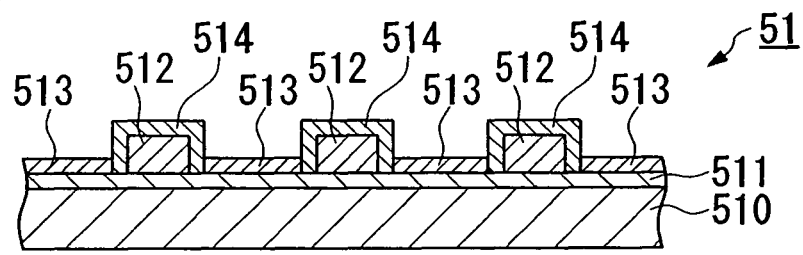

In the electrode substrate 51 shown in FIG. 21, the transparent conductive layer 511 is formed on the base material 510, and the metal circuit layer 512 is formed in a predetermined pattern on the transparent conductive layer 511. A shielding layer 513 that includes an oxide semiconductor thin film is provided on the transparent conductive layer 511, and the insulating layer 514 is formed on the metal circuit layer 512.

Figure 22:
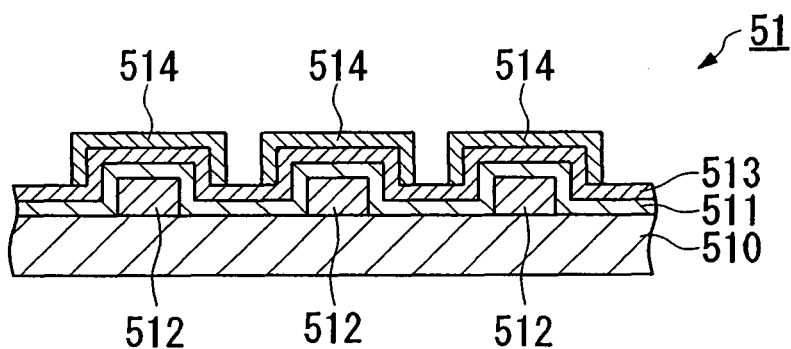

In the electrode substrate 51 shown in FIG. 22, the metal circuit layer 512 is formed in a predetermined pattern on the base material 510, and the transparent conductive layer 511 is formed on the metal circuit layer 512 so as to extend across an area that is wider than the region in which the metal circuit layer 512 is formed. The shielding layer 513 that includes an oxide semiconductor thin film is provided on the transparent conductive layer 511. Furthermore, the insulating layer 514 is formed on the shielding layer 513 overlapping the pattern of the metal circuit layer 512 so as to cover the top surfaces and side surfaces of the metal circuit layer 512.

Figure 23:
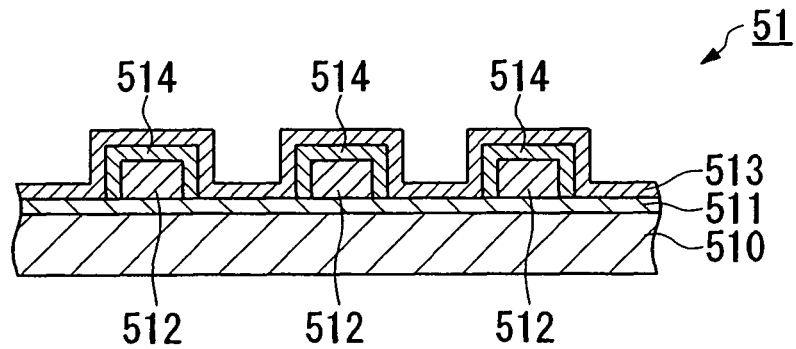

In the electrode substrate 51 shown in FIG. 23, the transparent conductive layer 511 is formed on the base material 510, and the metal circuit layer 512 is formed in a predetermined pattern on the metal circuit layer 511. The insulating layer 514 is formed on the metal circuit layer 512. The shielding layer 513 is formed not only on the transparent conductive layer 511, but also on the metal circuit layer 512 and the insulating layer 514.

Although less significant than the case of the metal circuit layer 512, it has been indicated that reverse electron transfer from the transparent conductive layer 511 is occurring. Therefore, by providing the shielding layer 513 so that it covers the transparent conductive layer 511, it is possible to obtain a greater shielding effect.

A compound may be selected for the material of the shielding layer 513 whose electron transfer reaction rate with an electrolyte solution that contains redox species is slow, and that has a high light transmittance and photoelectron transferring ability. Examples thereof include titanium oxide ($TiO_2$), zinc oxide (ZnO), niobium oxide ($Nb_2O_5$), tin oxide ($SnO_2$), fluorine-doped tin oxide (FTO), tin-doped indium oxide (ITO), and the like.

It is necessary for the shielding layer 513 to be formed thinly enough to not inhibit the transfer of electrons to the transparent conductive layer 511, and a thickness of about 10 to 3000 nm is preferable. Examples of methods for forming the shielding layer 513 include a sputtering method, an evaporation method, a spray thermal decomposition method (an SPD method), a spin coating method, a dipping method, and a doctor blade method. However, in these methods, the denseness of the shielding layer 513 and its adaptability to the surface configuration of the base material 510 may not necessarily be satisfactory, and it is difficult to obtain a sufficient shielding performance in the shielding of the metal circuit layer 512. Therefore, when forming the shielding layer 513 as well, it is necessary to form the insulating layer 514 either directly or via the transparent conductive layer 511 and shielding layer 513 and the like on the metal circuit layer 512. This enables the insulation and shielding of the metal circuit layer 512 to be achieved satisfactorily.

The method used to form the shielding layer 513 is not particularly limited, and examples thereof include forming a film of an oxide semiconductor which is the desired compound or a precursor thereof by performing a dry method (i.e., a vapor phase method) such as a sputtering method, an evaporation method or a CVD method. For example, when a film is being formed using a precursor of a metal or the like, the shielding layer 513 can be obtained by oxidizing the precursor using thermal treatment or chemical treatment.

If a wet method is used, after a solution that contains the desired compound or a precursor thereof has been coated using a method such as a spin coating method, a dipping method, or a blade coating method, the solution is chemically changed into the desired compound by thermal treatment or chemical treatment. As a result the shielding layer 513 can be obtained. Examples of the precursor include salts and complexes having constituent metallic elements of the desired compound. In order to obtain a more dense film, a solution is more preferable than a dispersion.

Other methods may be used to form the shielding layer 513 such as, for example, a spray thermal decomposition method (SPD) in which the shielding layer 513 is formed by heating the base material 510 having the transparent conductive layer 511, spraying a substance for forming a precursor of the shielding layer 513 onto the substrate 510 so as to thermally decompose it and change it into the desired oxide semiconductor.

In this manner, because it is possible to suppress the reverse transfer of electrons from the transparent conductive layer 511 by providing the shielding layer 513 that shields the transparent conductive layer 511, it is possible by using the electrode substrate of this embodiment to manufacture a photoelectric conversion element having a high photoelectric conversion efficiency.

It is possible, if so required by the characteristics thereof, to impart the shielding layer 513 with the properties of a protective layer that is provided, for example, for a different purpose than that of the insulating layer 514.

For example, in the electrode substrate 51 shown in FIG. 23, the shielding layer 513 can also be used as a protective layer to protect the metal circuit layer 512 and the insulating layer 514.

Figure 24:
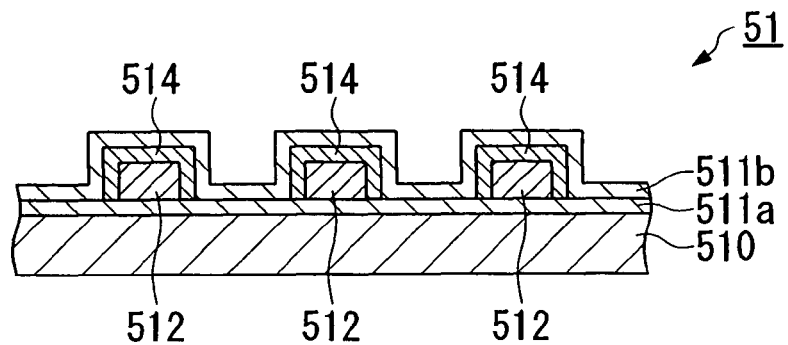

Yet a further embodiment of the electrode substrate of the present invention will now be described. In the electrode substrate 51 shown in FIG. 24, the metal circuit layer 512 is formed in a pattern such as a lattice pattern, a stripe pattern, a comb pattern or a wiring pattern on a first transparent conductive layer 511a, and the insulating layer 514 is provided on top of the metal circuit layer 512 so as to cover the metal circuit layer 512. Furthermore, a second transparent conductive layer 511b is formed above the tops of the metal circuit layer 512 and the insulating layer 514. In other words, the metal circuit layer 512 and the insulating layer 514 are sandwiched between the first transparent conductive layer 511a and the second transparent conductive layer 511b. The first and second transparent conductive layers 511a and 511b are the same as the above-described transparent layer 511, and are thin films made of conductive metal oxides such as ITO and FTO.

According to the electrode substrate 51 having such a structure, the insulation and shielding of the metal circuit layer 512 is provided by the insulating layer 514, and the metal circuit layer 512 and the insulating layer 514 can be protected by the second transparent conductive layer 511b. By providing the second transparent conductive layer 511b in conjunction with the first transparent conductive layer 511a, an improvement in the current collecting efficiency can be expected.

Next, the photoelectric conversion element of the present embodiment will be described.

Figure 25:
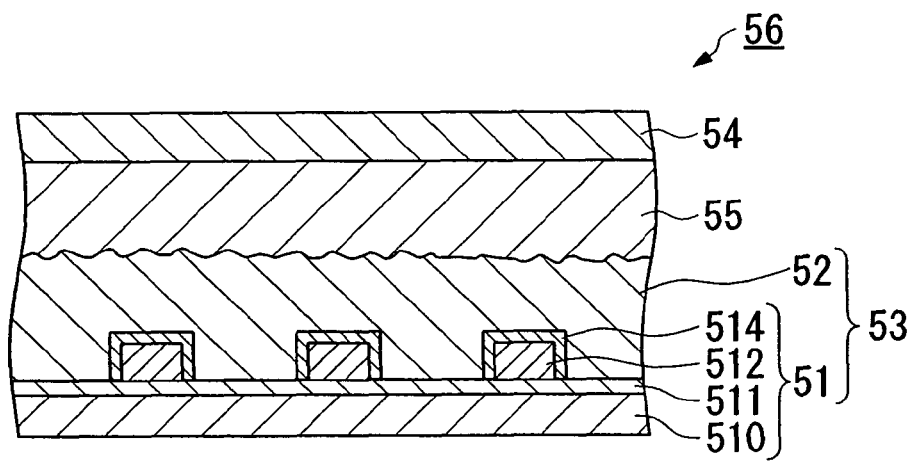
FIG. 25 is a cross-sectional view showing yet another embodiment of the photoelectric conversion element of the present invention.
Figure 26A:
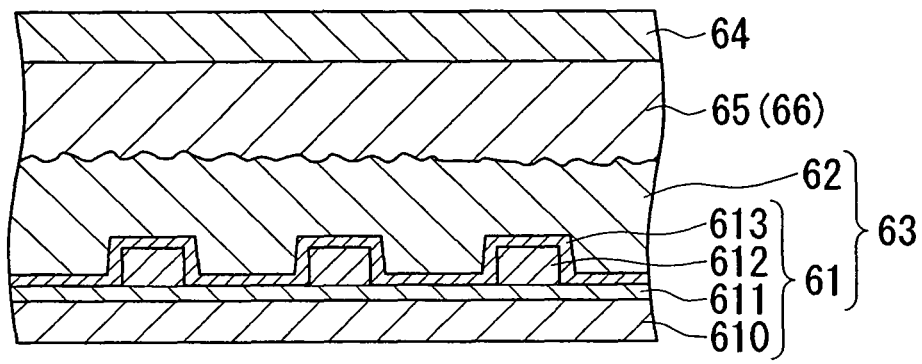
FIGS. 26A and 26B are cross-sectional views showing an example of a conventional photoelectric conversion element.
Figure 26B:
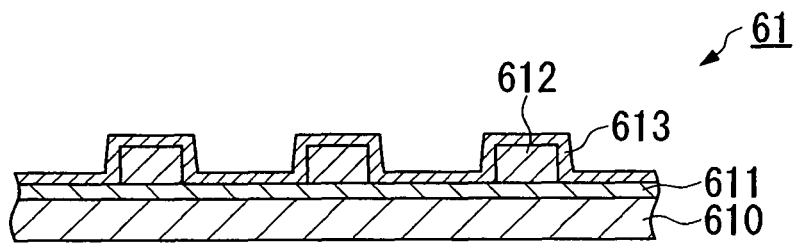
Figure 27:
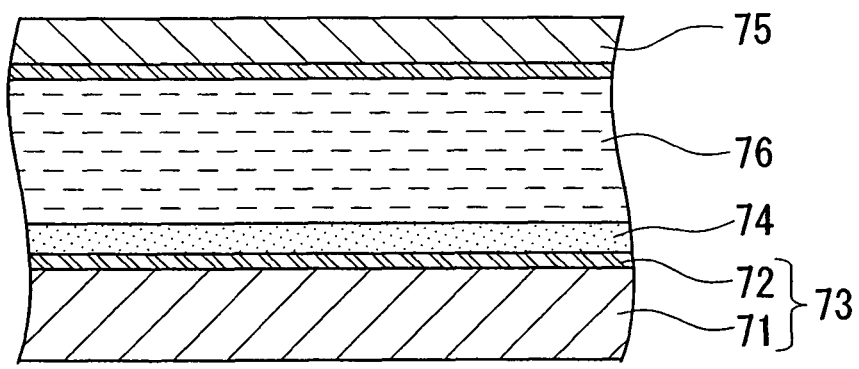
FIG. 27 is a cross-sectional view of a conventional dye-sensitized solar cell.

FIG. 25 shows an example of a photoelectric conversion element that forms a dye-sensitized solar cell. This photoelectric conversion element 56 is provided with: an electrode substrate 51; a working electrode 53 that is made on top of the electrode substrate 51 of oxide semiconductor fine particles of titanium oxide or the like, and that has an oxide semiconductor porous film 52 in which a photo-sensitizing dye is provided; and a counter electrode 54 that is provided opposite the working electrode 53. An electrolyte such as an electrolyte solution or a charge transfer layer 55 that is made of a p-type semiconductor is provided between the working electrode 53 and the counter electrode 54. In the photoelectric conversion element 56 of this example, the oxide semiconductor porous film 52 in which the photo-sensitizing dye is provided is formed on the surface of the electrode substrate 51, and the working electrode 53 of the photoelectric conversion element 56 is constructed by the electrode substrate 51 and the oxide semiconductor porous film 52.

In FIG. 25, the electrode substrate 51 is illustrated the electrode substrate 51 having the structure shown in FIG. 14, however, the electrode substrate is not limited to this and the electrode substrate of any of the above-described embodiments may be used.

The oxide semiconductor porous film 52 is a porous thin film made of oxide semiconductor fine particles of one or more of titanium oxide ($TiO_2$), tin oxide ($SnO_2$), tungsten oxide ($WO_3$), zinc oxide (ZnO), and niobium oxide ($Nb_2O_5$). The average particle size of the oxide semiconductor fine particles is preferably in a range of 1 to 1000 nm. The thickness of the oxide semiconductor porous film 52 is preferably in a range of about 0.5 to 50 μm.

The method for forming the oxide semiconductor porous film 52 is not particularly limited and it can be formed, for example, by employing methods such as a method in which a dispersion solution that is obtained by dispersing commercially available oxide semiconductor fine particles in a desired dispersion medium, or a colloid solution that can be prepared using a sol-gel method is coated, after desired additives have been added thereto if these are required, using a known coating method such as a screen printing method, an inkjet printing method, a roll coating method, a doctor blade method, a spin coating method, a spray coating method, or the like. Other methods include: a migration electrodeposition method in which the electrode substrate 51 is immersed in colloid solution and oxide semiconductor fine particles are made to adhere to the electrode substrate 51 by electrophoresis; a method in which a foaming agent is mixed in a colloid solution or dispersion solution which is then coated and baked so as to form a porous material; and a method in which polymer microbeads are mixed together and coated on, and these polymer microbeads are then removed by thermal treatment or chemical treatment, so as to define spaces and thereby form a porous material.

The sensitizing dye that is provided in the oxide semiconductor porous film 52 is not particularly limited. For example, a dye that provides excitation behavior that is appropriate to the application and the semiconductor is used and can be selected from among ruthenium complexes and iron complexes having ligands that include bipyridine structures, terpyridine structures, and the like; metal complexes such as porphyrin systems and phthalocyanine systems; as well as from among organic dyes such as eosin, rhodamine, and melocyanine.

When the charge transfer layer 55 is made using an electrolyte, for example, an electrolyte solution that contains a redox pair may be used. It is also possible to use a gelled electrolyte obtained by quasi-solidifying the aforementioned electrolyte solution using an appropriate gelling agent. As the solvent for the electrolyte solution, a solvent can be selected and used from room temperature molten salts made up of acetonitrile, methoxy acetonitrile, propionitrile, ethylene carbonate, propylene carbonate, diethyl carbonate, and γ-butyrolactone. Examples of the room temperature molten salt include salts made of quaternary imidazolium based cations and iodide ions or bistrifluoromethyl sulfonylimido anions, and the like.

The redox pair that is contained in the electrolyte is not particularly limited. For example, pairs such as iodine/iodide ions, bromine/bromide ions, and the like may be added. For the supply source of iodide ions or the bromide ions, lithium salt, quaternary imidazolium salt, tetrabutylammonium salt, and the like may be used alone or in a combination. Additives, such as tert-butylpyridine and the like, can be added if necessary to this electrolyte.

Instead of an electrolyte, it is also possible to use a p-type semiconductor for the charge transfer layer 55. As the p-type semiconductor, it is preferable to use, for example, monovalent copper compounds such as copper iodide, copper thiocyanide and the like. The method for forming the charge transfer layer 55 using a p-type semiconductor is not particularly limited, and examples thereof include a casting method, a sputtering method, and an evaporation method. It is also possible for appropriate additives to be included in the p-type semiconductor where these are necessary for film formation.

As the counter electrode 54, it is possible to form an electrode from a conductive oxide semiconductor such as a carbon based material, a metal such as gold or platinum, or ITO or FTO on a substrate made of a non conductive material such as glass.

If the electrode is, for example, a platinum film, methods include a method in which a platinum layer is formed by first coating a solution of $H_2PtCl_6$ and then thermal treatment is performed thereon. Alternatively, an electrode can be formed on a substrate using an evaporation method or a sputtering method.

When a solid p-type semiconductor is used for the charge transfer layer 55, it is also possible to use a method in which a layer of a conductive material to be used as the electrode of the counter electrode 54 is directly formed on the charge transfer layer 55 using a method such as sputtering or coating.

According to the photoelectric conversion element 56 of this embodiment, because the insulating layer 514 of the electrode substrate 51 has heat-resistant ceramic as its main component, it has excellent heat resistance and acid resistance. As a result, there is no deterioration caused by the thermal history during manufacturing. Consequently, the metal circuit layer 512 is reliably shielded from the electrolyte solution of the charge transfer layer 55, and corrosion of the metal circuit layer 512 as well as leak current are effectively prevented. Contact between the metal circuit layer 512 and the electrolyte layer 55 is prevented, reduction outputs caused by corrosion or leak current are suppressed, and the cell characteristics are greatly improved.

EXAMPLE E1

Manufacturing of Electrode Substrate

An electrode substrate 51 such as that shown in FIG. 15 was manufactured by the procedure described below.

A 100×100 mm glass substrate provided with an FTO film was used as the transparent conductive layer 511 and the base material 51. A silver printing paste (having a volume resistivity after baking of $3\times10^{-6}\Omega$) was screen printed on the surface of the glass substrate. After 10 minutes of leveling, the paste was dried in a hot air circulating furnace at 135° C. for 20 minutes, and was then baked at 550° C. for 15 minutes so as to form the metal circuit layer 512 having a silver circuit. The circuit width of the metal circuit layer 512 was 150 μm, while the film thickness was 5 μm. The metal circuit layer 512 was formed extending in a strip shape from a current collecting terminal. The five types of overcoat materials shown in Table 1 were respectively printed overlapping the metal circuit layer 512 by screen printing while alignment was conducted using a CCD camera. As a result, the insulating layer 514 was formed. The width of the insulating layer 514 is such that an excess of 100 μm per side is formed on both sides in the transverse direction of the metal circuit layer 512, and the desired height from the surface of the glass substrate was 10 μm. As a result, the thickness of the obtained insulating layer 514 from the metal circuit layer 512 was about 5 μm.

In Example E1-2 in Table 1, the term "alumina+metal alkoxide/low melting point glass paste" represents a first insulating layer having as its main components "alumina+ metal alkoxide" laminated on top of a second insulating layer having as its main component "low melting point glass". The second insulating layer is formed using a PbO—$B_2O_3$ based commercially available low melting point glass paste, and was laminated on top of the first insulating layer by screen printing. In this case, the thickness of the first insulating layer is about 5 μm, and the thickness of the second insulating layer is about 5 μm.

(Manufacturing of Photoelectric Conversion Element)

A dispersion solution of titanium oxide containing titanium oxide having an average particle size of 20 to 25 nm was coated on the electrode substrate 51 that was obtained. It was then dried, and baked for one hour at 450° C. As a result, an oxide semiconductor porous film 52 was formed. It was then immersed overnight hours in an ethanol solution of a ruthenium bipyridine complex (an N3 dye) so as to be sensitized with a dye. As a result, the working electrode 53 was prepared.

For the counter electrode 54, a platinum sputtered FTO glass electrode substrate was used. This counter electrode 54 and the working electrode 53 were positioned facing each other with a 50 μm thick thermoplastic resin sheet interposed between the two as a spacer. The two electrodes 53 and 54 were then secured by heat-melting the resin sheet. At this time, a portion of the counter electrode 54 side was left open in order to define an electrolyte injection aperture. A methoxy acetonitrile solution that contained 0.5 M of an iodide salt and 0.05M of iodine as main components was then injected via this solution injection aperture so as to form the charge transfer layer 55. Next, peripheral portions and the solution injection aperture were fully sealed by a thermoplastic resin sheet and an epoxy based sealing resin, and current collecting terminal portions were formed using glass solder so as to prepare a photoelectric conversion element for use as a test cell.

When the photoelectric conversion characteristics of this test cell were evaluated using 100 mW/cm² pseudo sunlight having an AM of 1.5, the photoelectric conversion efficiency results shown in Table 1 were obtained.

TABLE 1

| | Main components of overcoat material | Photoelectric conversion efficiency (%) |
|---|---|---|
| Example E1-1 | alumina + metal alkoxide | 3.9 |
| Example E1-2 | alumina + metal alkoxide/ low melting point glass paste | 3.7 |
| Example E1-3 | zirconia | 3.5 |
| Example E1-4 | silica | 3.3 |
| Example E1-5 | alumina + alkyl silicate + metal alkoxide | 3.5 |

EXAMPLE E2

Manufacturing of an Electrode Substrate

An electrode substrate 51 such as that shown in FIG. 16 was manufactured by the procedure described below.

Using a 100×100 mm glass substrate as the base material 510, a gold circuit (i.e., the metal circuit layer 512) was formed on the surface thereof using a plating method. The shape of the circuit was the same as in Example E1, and the circuit thickness was 2 μm. An FTO/ITO composite film having a thickness of 1000 nm was formed using a spray thermal decomposition method on the top of the glass substrate and the gold circuit. Furthermore, using test material 1 of Table 1, in the same procedures as in Example E1, the insulating layer 514 was formed to match the pattern on the metal circuit layer 512.

(Manufacturing of a Photoelectric Conversion Element)

Using the obtained electrode substrate 51, a photoelectric conversion element was manufactured for use as a test cell using the same procedure as in example E1. When this photoelectric conversion element was evaluated, the photoelectric conversion efficiency was 3.0%.

EXAMPLE E3

An electrode substrate 51 such as that shown in FIG. 19 was manufactured by the procedure described below.

Using a 100×100 mm glass substrate as the base material 510, grooves 10a having a depth of 10 μm and a width of 500 μm were etched to correspond to a strip shaped wiring pattern on the surface thereof. An FTO/ITO composite film having a thickness of 1000 nm was formed using a spray thermal decomposition method on the top thereof. Furthermore, using the same procedure as in Example E1, a silver printed wiring layer was formed. The silver wiring was formed to a height of 2 μm from the surface of the base material 510b by multiple printings. The width of the metal circuit layer 512 was 200 μm wider than the width of the grooves 510a on each side of the grooves 510a. Furthermore, using test material 1 of Table 1, in the same procedures as in Example 1, the insulating layer 514 was formed so as to cover the top of the metal circuit layer 512 and so as so that the wiring corresponds to the pattern of the metal circuit layer 512.

(Manufacturing of a Photoelectric Conversion Element)

Using the obtained electrode substrate 51, a photoelectric conversion element was manufactured for use as a test cell using the same procedure as in example E1. When the photoelectric conversion characteristics of this test cell were evaluated, the conversion efficiency was 4.2%.

COMPARATIVE EXAMPLE E1

A metal circuit layer 512 was formed using a silver printing paste on the surface of a 100 mm×100 mm heat-resistant glass plate (i.e. substrate) using the same procedure as in Example E1. Next, using the same procedure as in Example E2, an FTO/ITO composite film having a thickness of 1000 nm was formed on the metal circuit layer 512 to function as both a transparent conductive layer and a shielding layer. As a result, the electrode substrate 51 was manufactured.

(Manufacturing of Photoelectric Conversion Element)

Using this electrode substrate 51, a photoelectric conversion element was manufactured for use as a test cell by the same procedure as that in Example E1. When the electrolyte injected into this test cell was observed, while the color was blackish brown immediately after the injection, it changed after several minutes to being substantially transparent. The reason for this was thought to be that because the shielding of the silver circuit was insufficient, the $I_3^-$ ions in the electrolyte were reacting with the exposed silver and were reduced to $I^-$. When the photoelectric conversion characteristics of this test cell were evaluated using pseudo sunlight having an AM of 1.5, the conversion efficiency was 0.20%.

From this, it was found that, if the shielding layer is not provided, the silver circuit is not sufficiently shielded, and the characteristics of a substrate provided with a metal circuit layer could not be suitably exhibited.

COMPARATIVE EXAMPLE E2

Manufacturing of Electrode Substrate

A gold circuit (i.e., a metal circuit layer) was formed in the same procedures as in Example E2 on the surface of a 100 mm×100 mm glass substrate provided with an FTO film by a plating method. Next, using the same procedure as in Example E2, an FTO film to be used as both a transparent conductive layer and a shielding layer and having a film thickness of 300 nm was formed on this metal circuit layer. As a result, the electrode substrate 51 was manufactured.

When the surface of the electrode substrate 51 that was formed in this manner was observed using an SEM and analyzed with an EDX, undercut were observed that was considered to have been caused by the plating resist remaining like a trail at the bottom portion of the metal circuit layer 512 which resulted in the coating of FTO not being provided in shadow portions of this undercut.

(Manufacturing of Photoelectric Conversion Element)

Using this electrode substrate 51, a photoelectric conversion element was manufactured for use as a test cell by the same procedure as in Example E1. When the photoelectric conversion characteristics of this test cell were evaluated using pseudo sunlight having an AM of 1.5, the conversion efficiency was 0.41%. In this case, it was found that if the shielding of the metal circuit layer 512 is insufficient, the characteristics of a substrate provided with a metal circuit layer cannot not be suitably elicited.

COMPARATIVE EXAMPLE E3

Manufacturing of Electrode Substrate

A 100 mm×100 mm glass substrate provided with an FTO film was used by itself as the transparent conductive layer 51 without the metal circuit layer being provided on the surface thereof, and a photoelectric conversion element was manufactured for use as a test cell using the same procedure as in Example E1. When the photoelectric conversion characteristics of this test cell were evaluated using pseudo sunlight having an AM of 1.5, the conversion efficiency was 0.23%. From this fact, it was found that when the metal circuit layer is not provided, the photoelectric conversion efficiency of the photoelectric conversion element is reduced due to the high resistance of the electrode substrate 51.

INDUSTRIAL APPLICABILITY

The electrode substrate of the present invention has a metal circuit layer and a transparent conductive layer that is electrically connected to this metal circuit layer. The metal circuit layer and the transparent conductive layer are provided on a base material. The metal circuit layer is covered and insulated by an insulating layer. Accordingly, the metal circuit layer can be reliably shielded from an electrolyte solution and the like, and it is possible to prevent control corrosion and leak current thereof. Compared with when a transparent conductive film alone is used as an electrode conductive body, the conductivity is excellent.

The invention claimed is:

1. An electrode substrate, comprising:
   a base material;
   a metal circuit layer that is provided on the base material; and
   a transparent conductive layer that is electrically connected to the metal circuit layer, and wherein
   the metal circuit layer is covered by a plurality of insulating layers; and the plurality of insulating layers comprise a material that includes a glass component, wherein the glass component is present as a paste that contains glass frit, such that the plurality of insulating layers is formed by printing said paste, and
   the paste comprises two or more types of glass paste that have different melting temperatures.

2. The electrode substrate according to claim 1, wherein the metal circuit layer is formed by using a printing method.

3. A photoelectric conversion element, comprising:
   the electrode substrate according to claim 1;
   a counter electrode that is placed facing a side of the electrode substrate above which the transparent conductive layer side is provided; and
   an electrolyte layer or charge transfer layer that is provided between the counter electrode and the electrode substrate.

4. A dye-sensitized solar cell comprising:
   the electrode substrate according to claim 1;
   a semiconductor porous film that is provided on a side of the electrode substrate above which the transparent conductive layer side is provided;
   a sensitizing dye that is provided on a surface of the semiconductor porous film;
   a counter electrode that is placed facing the semiconductor porous film; and
   an electrolyte layer or charge transfer layer that is provided between the counter electrode and the electrode substrate above which the semiconductor porous film is formed.

* * * * *